United States Patent
Bell

(10) Patent No.: US 7,273,981 B2
(45) Date of Patent: *Sep. 25, 2007

(54) THERMOELECTRIC POWER GENERATION SYSTEMS

(75) Inventor: Lon E. Bell, Altadena, CA (US)

(73) Assignee: BSST, LLC., Irwindale, CA (US)

( * ) Notice: Subject to any disclaimer, the term of this patent is extended or adjusted under 35 U.S.C. 154(b) by 778 days.

This patent is subject to a terminal disclaimer.

(21) Appl. No.: 10/642,980

(22) Filed: Aug. 18, 2003

(65) Prior Publication Data

US 2004/0031514 A1 Feb. 19, 2004

Related U.S. Application Data

(63) Continuation-in-part of application No. 10/164,656, filed on Jun. 6, 2002, now Pat. No. 6,625,990, which is a continuation-in-part of application No. 10/074,543, filed on Feb. 11, 2002, now Pat. No. 6,637,210, and a continuation-in-part of application No. 09/971,539, filed on Oct. 2, 2001, now Pat. No. 6,606,866, and a continuation-in-part of application No. 09/918,999, filed on Jul. 31, 2001, now Pat. No. 6,598,405, and a continuation-in-part of application No. 09/844,818, filed on Apr. 27, 2001, now Pat. No. 6,539,725.

(60) Provisional application No. 60/267,657, filed on Feb. 9, 2001.

(51) Int. Cl.
*H01L 35/32* (2006.01)

(52) U.S. Cl. .............. 136/205; 136/206; 136/208; 136/212; 136/201

(58) Field of Classification Search ......... 136/205–212

See application file for complete search history.

(56) References Cited

U.S. PATENT DOCUMENTS

| | | | |
|---|---|---|---|
| 2,027,534 | A | 1/1936 | Ingersoll |
| 2,944,404 | A | 7/1960 | Fritts |
| 2,949,014 | A | 8/1960 | Belton, Jr. et al. |
| 3,004,393 | A | 10/1961 | Alsing |
| 3,006,979 | A | 10/1961 | Rich |
| 3,071,495 | A | 1/1963 | Hänlein |
| 3,126,116 | A | 3/1964 | Clinehens |
| 3,129,116 | A | 4/1964 | Corry |
| 3,178,895 | A | 4/1965 | Mole et al. |
| 3,213,630 | A | 10/1965 | Mole |

(Continued)

FOREIGN PATENT DOCUMENTS

GB 2267338 12/1993

(Continued)

OTHER PUBLICATIONS

International Search Report for PCT/US 02/06285 dated May 11, 2002.

(Continued)

*Primary Examiner*—Nam Nguyen
*Assistant Examiner*—Anthony Fick
(74) *Attorney, Agent, or Firm*—Knobbe Martens Olson & Bear LLP

(57) ABSTRACT

Representative configurations for improved thermoelectric power generation systems to improve and increase thermal efficiency are disclosed.

22 Claims, 25 Drawing Sheets

U.S. PATENT DOCUMENTS

| | | |
|---|---|---|
| 3,527,621 A | 9/1970 | Newton |
| 3,607,444 A | 9/1971 | DeBucs |
| 3,626,704 A | 12/1971 | Coe, Jr. |
| 3,635,037 A | 1/1972 | Hubert |
| 3,663,307 A | 5/1972 | Mole |
| 3,681,929 A | 8/1972 | Schering |
| 3,779,814 A | 12/1973 | Miles et al. |
| 3,817,043 A | 6/1974 | Zoleta |
| 4,038,831 A | 8/1977 | Gaudel et al. |
| 4,065,936 A | 1/1978 | Fenton et al. |
| 4,125,122 A * | 11/1978 | Stachurski ............... 136/205 |
| 4,281,516 A | 8/1981 | Berthet et al. |
| 4,297,841 A | 11/1981 | Cheng |
| 4,420,940 A | 12/1983 | Buffet |
| 4,494,380 A | 1/1985 | Cross |
| 4,499,329 A | 2/1985 | Benicourt et al. |
| 4,730,459 A | 3/1988 | Schlicklin et al. |
| 4,731,338 A | 3/1988 | Ralston et al. |
| 4,905,475 A | 3/1990 | Tuomi |
| 4,989,626 A | 2/1991 | Takaga et al. |
| 5,038,569 A | 8/1991 | Shirota et al. |
| 5,092,129 A | 3/1992 | Bayes et al. |
| 5,097,829 A | 3/1992 | Quisenberry |
| 5,193,347 A | 3/1993 | Apisdorf |
| 5,228,923 A | 7/1993 | Hed |
| 5,232,516 A | 8/1993 | Hed |
| 5,385,020 A | 1/1995 | Gwilliam et al. |
| 5,429,680 A | 7/1995 | Fuschetti |
| 5,499,504 A | 3/1996 | Mill et al. |
| 5,584,183 A | 12/1996 | Wright et al. |
| 5,592,363 A | 1/1997 | Atarashi et al. |
| 5,605,047 A | 2/1997 | Park et al. |
| 5,682,748 A | 11/1997 | De Vilbiss et al. |
| 5,802,856 A | 9/1998 | Schaper et al. |
| 5,860,472 A | 1/1999 | Batchelder |
| 5,867,990 A | 2/1999 | Ghoshal |
| 5,900,071 A | 5/1999 | Harman |
| RE36,242 E | 6/1999 | Apisdorf |
| 5,921,088 A | 7/1999 | Imaizumi et al. |
| 5,966,941 A | 10/1999 | Ghoshal |
| 5,987,890 A | 11/1999 | Chiu et al. |
| 6,000,225 A | 12/1999 | Ghoshal |
| 6,082,445 A | 7/2000 | Dugan |
| 6,084,172 A | 7/2000 | Kishi et al. |
| 6,096,966 A | 8/2000 | Nishimoto et al. |
| 6,282,907 B1 | 9/2001 | Ghoshal |
| 6,319,744 B1 | 11/2001 | Hoon et al. |
| 6,334,311 B1 | 1/2002 | Kim et al. |
| 6,346,668 B1 | 2/2002 | McGrew |
| 6,347,521 B1 | 2/2002 | Kadotani et al. |
| 6,366,832 B2 | 4/2002 | Lomonaco et al. |
| 6,367,261 B1 | 4/2002 | Marshall et al. |
| 6,401,462 B1 | 6/2002 | Bielinski |
| 6,412,287 B1 | 7/2002 | Hughes et al. |
| 6,446,442 B1 | 9/2002 | Batchelor et al. |
| 6,477,844 B2 | 11/2002 | Ohkubo et al. |
| 6,481,213 B2 | 11/2002 | Carr et al. |
| 6,510,696 B2 | 1/2003 | Guttman et al. |
| 6,530,231 B1 | 3/2003 | Nagy et al. |
| 6,530,842 B1 | 3/2003 | Wells et al. |
| 6,560,968 B2 | 5/2003 | Ko |
| RE38,128 E | 6/2003 | Gallup et al. |
| 6,650,968 B2 | 11/2003 | Ko |
| 6,948,321 B2 * | 9/2005 | Bell ............................. 62/3.2 |
| 7,111,465 B2 * | 9/2006 | Bell ............................. 62/3.7 |
| 2002/0014261 A1 | 2/2002 | Caillat et al. |
| 2002/0139123 A1 | 10/2002 | Bell |
| 2002/0148234 A1 | 10/2002 | Bell |
| 2003/0079770 A1 | 5/2003 | Bell |
| 2003/0094265 A1 | 5/2003 | Chu et al. |

FOREIGN PATENT DOCUMENTS

| | | |
|---|---|---|
| JP | 56-18231 | 2/1981 |
| JP | 4-165234 | 6/1992 |
| JP | 5-219765 | 8/1993 |
| SE | 329 870 | 10/1970 |
| SE | 337 227 | 5/1971 |
| WO | PCT/US02/03772 | 7/2002 |
| WO | WO 02/065030 A1 | 8/2002 |
| WO | PCT/US03/24899 | 8/2003 |
| WO | PCT/US2004/026757 | 3/2005 |

OTHER PUBLICATIONS

International Search Report for PCT/US 02/03654 dated May 20, 2002.

International Search Report for PCT/US 02/03659 dated Jul. 09, 2002.

International Search Report for PCT/US 02/25233 dated Sep. 24, 2002.

International Search Report for PCT/US 03/17834 dated Jul. 29, 2003.

A New Concept for Improving Thermoelectric Heat Pump Efficiency, R.J. Buist, J.W. Fenton and J.S. Lee, Borg-Warner Thermoelectrics Wolf and Algonquin Road.

Tada, Shigeru, et al., A New Concept of Porous thermoelectric Module Using a Reciprocating Flow for Cooling/Heating System (Numerical Analysis for Heating System), 16th International Conference on Thermoelectrics (1997).

Goldsmid, H.J., *Electronic Refrigeration*, Pion Ltd., 207 Brondesbury Park, London (1986).

Angrist, Stanley W., *Direct Energy Conversion*, 32 Ed. Ally & Bacon (1976).

Miner, A., Majumdar, A., and U. Ghoshal, Thermo-Electro-Mechanical Refrigeration Based on Transient Thermoelectric Effects, Applied Physics letters, vol. 75, pp. 1176-1178 (1999).

Buist, R. and Lau, P., Theoretical Analysis of Thermoelectric Cooling Performance Enhancement Via Thermal and Electrical Pulsing, Journal of Thermoelectricity, No. 4, 1996.

Copending U.S. Appl. No. 09/844,818, filed Apr. 27, 2001 and pending claims.

Copending U.S. Appl. No. 10/227,398, filed Aug. 23, 2002 and pending claims.

Copending U.S. Appl. No. 09/860,725, filed May 18, 2001 and pending claims.

Copending U.S. Appl. No. 10/632,235, filed Jul. 31, 2003 and pending claims.

Copending U.S. Appl. No. 09/918,999, filed Jul. 31, 2001 and pending claims.

Copending U.S. Appl. No. 10/215,613, filed Aug. 7, 2002 and pending claims.

Copending U.S. Appl. No. 09/987,232, filed Nov. 6, 2001 and pending claims.

Copending U.S. Appl. No. 10/074,543, filed Feb. 11, 2002 and pending claims.

Copending U.S. Appl. No. 10/164,656, filed Jun. 6, 2002 and pending claims.

Co-pending U.S. Appl. No. 10/405,001, filed Mar. 31, 2003.

Co-pending U.S. Appl. No. 10/642,773, filed Aug. 12, 2003.

Co-pending U.S. Appl. No. 10/632,235, Jul. 31, 2003.

Co-pending U.S. Appl. No. 10/897,292, filed Jul. 22, 2004.

Bell, L.E., "Use of Thermal Isolation to Improve Thermoelectric System Operating Efficiency," Proc. 21st Int'l Conf. on Thermoelectrics, Long Beach, CA (Aug. 2002).

Bell, L.E., "Increased Thermoelectric System Thermodynamic Efficiency by Use of Convective Heat Transport," Proc. 21st Int'l Conf. on Thermoelectrics, Long Beach, CA (Aug. 2002).

Ikoma, K., et al., "Thermoelectric Module and Generator for Gasoline Engine Vehicles," 17th Int'l Conf. on Thermo-electrics, Nagoya, Japan, pp. 464-467 (1998).

A New Concept for Improving Thermoelectric Heat Pump Efficiency, R.J. Buist, J.W. Fenton and J.S. Lee, Borg-Warner Thermoelectrics Wolf and Algonquin Road, year not available.

* cited by examiner

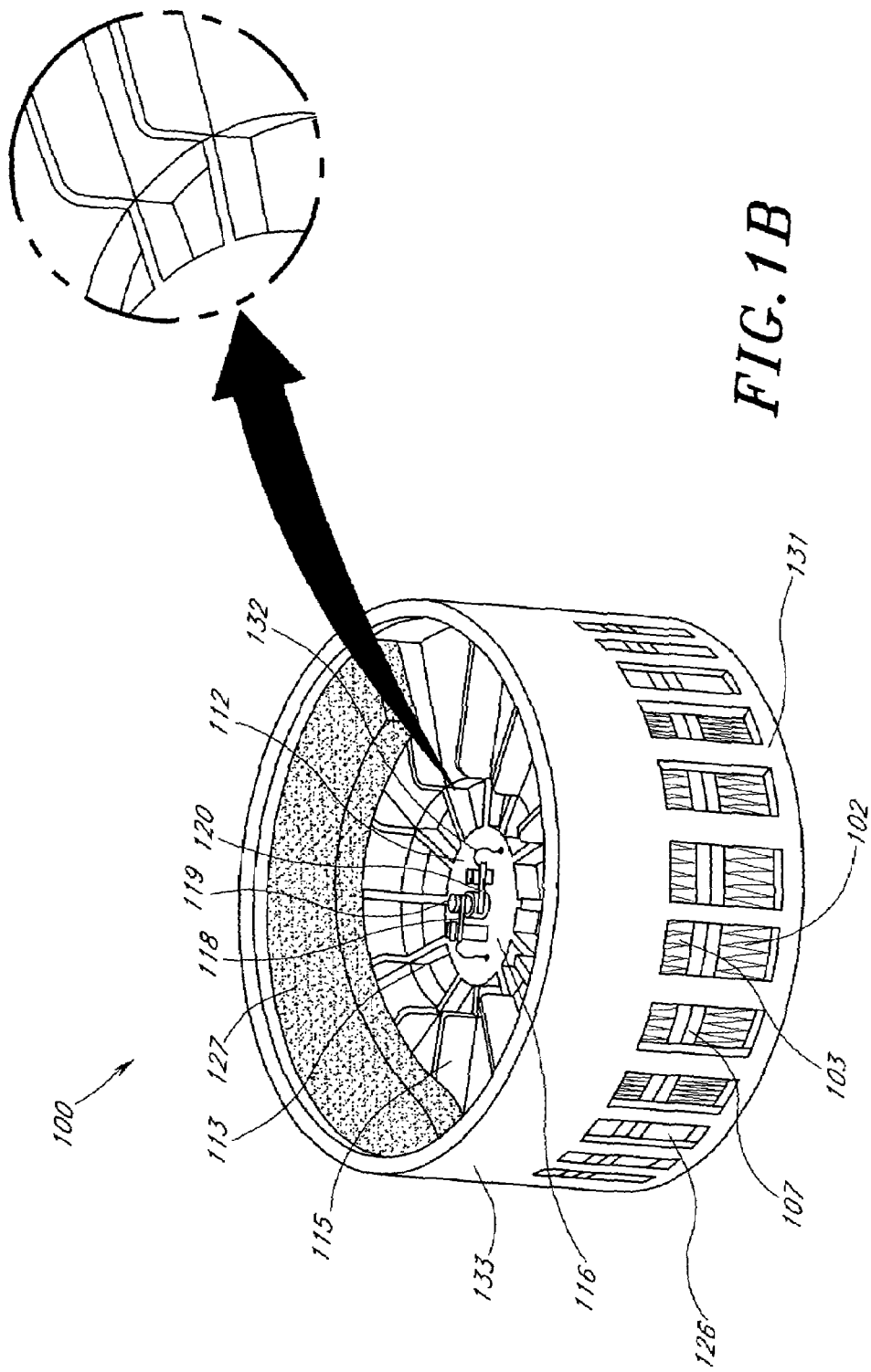

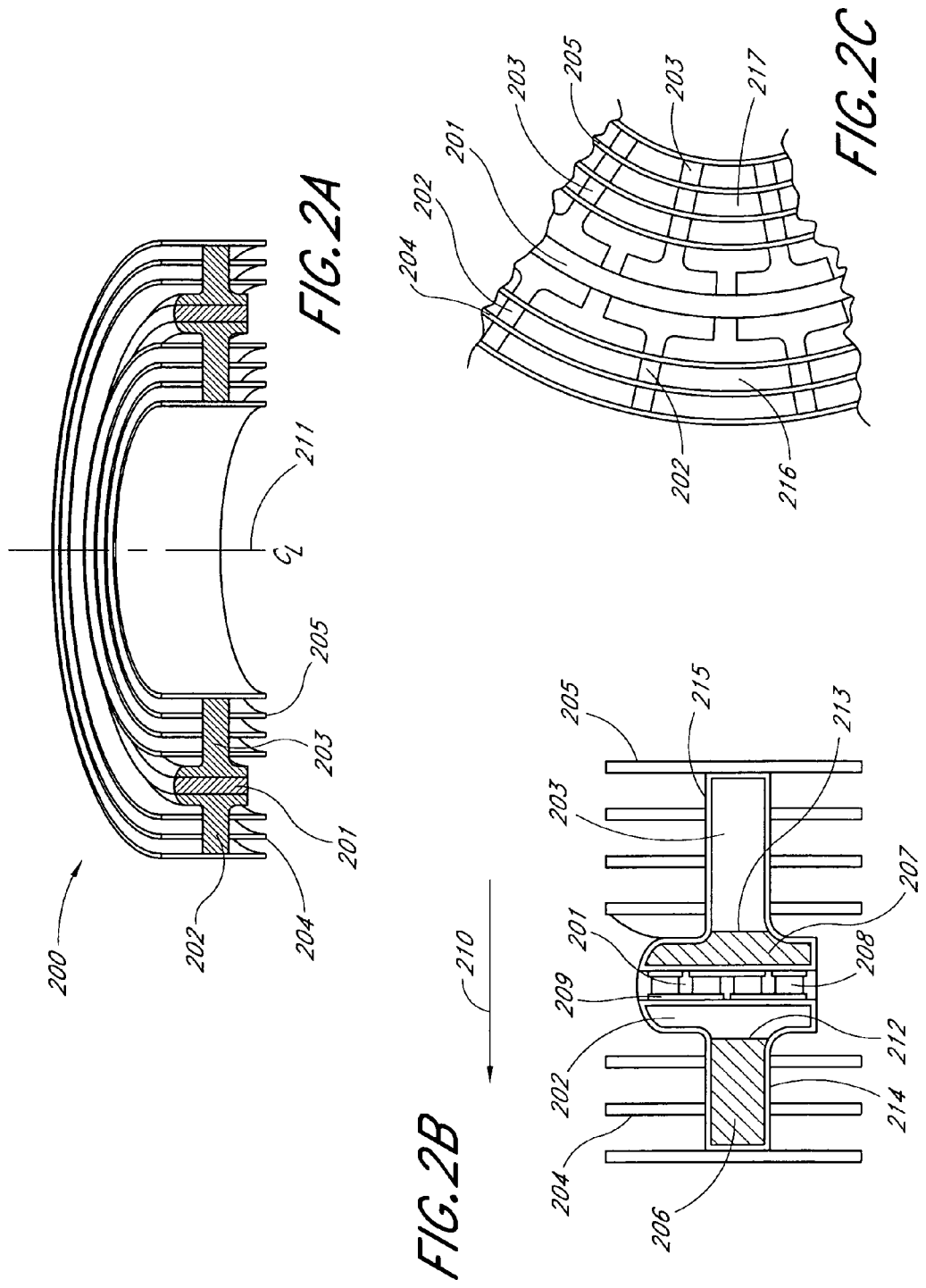

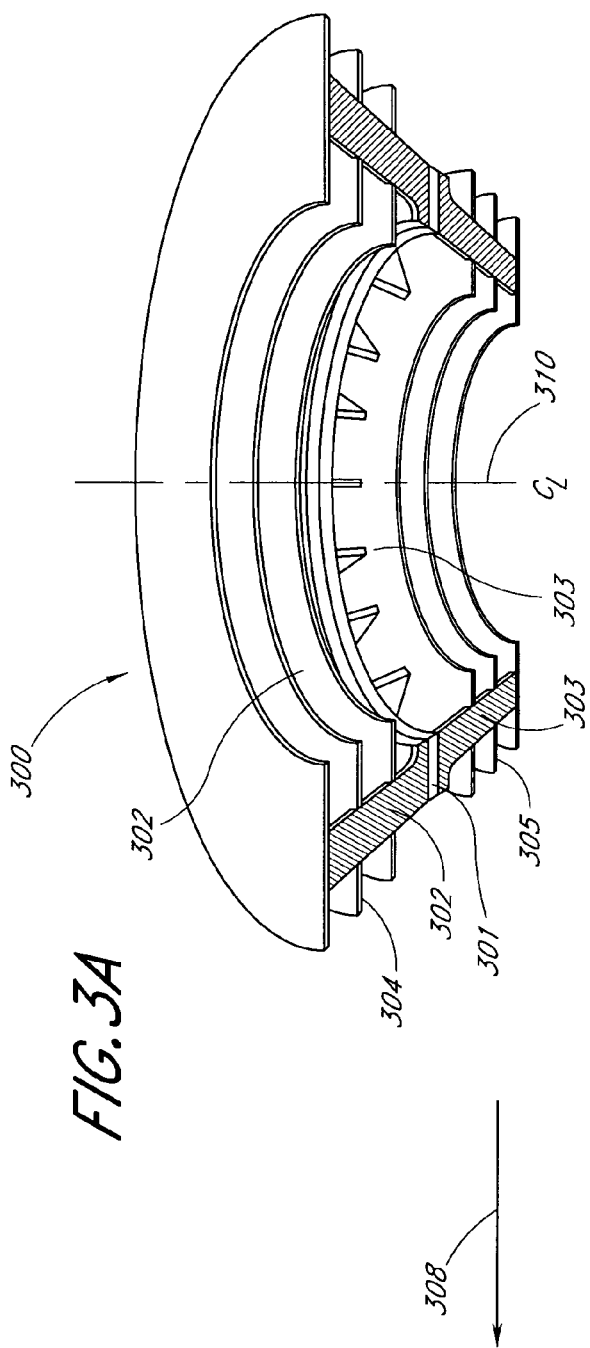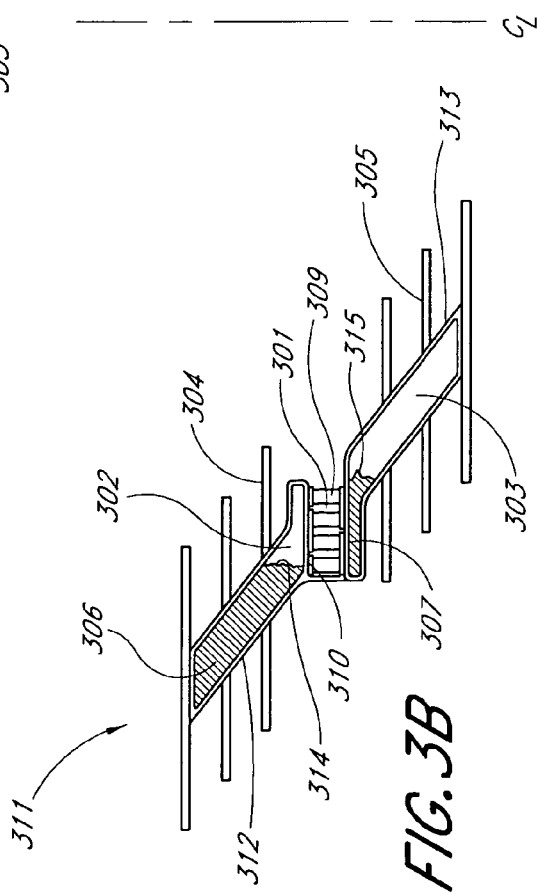
FIG.3A
FIG.3B

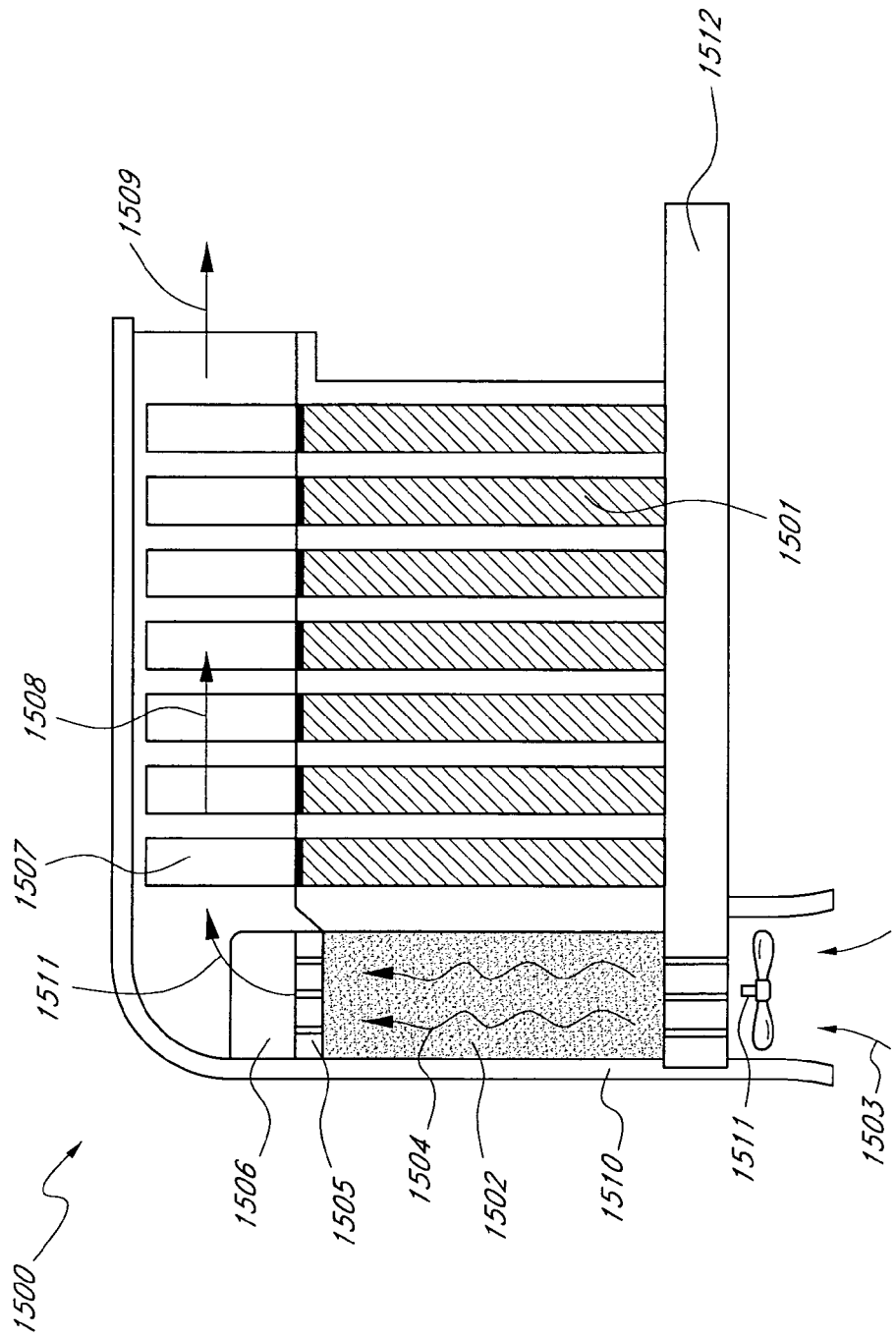

THERMOELECTRIC POWER GENERATION SYSTEMS

PRIOR RELATED PROVISIONAL AND PATENT APPLICATIONS

This application is a continuation-in-part of U.S. patent application Ser. No. 10/164,656, file Jun. 6, 2002 (now U.S. Pat. No. 6,625,990), which is a continuation-in-part of U.S. patent application Ser. No. 10/074,543, filed Feb. 11, 2002 (now U.S. Pat. No. 6,637,210), and a continuation-in-part of U.S. patent application Ser. No. 09/971,539 filed Oct. 2, 2001 (now U.S. Pat. No. 6,606,866), and a continuation-in-part of U.S. patent application Ser. No. 09/918,999, filed Jul. 31, 2001 (now U.S. Pat. No. 6,598,405) and a continuation-in-part of U.S. patent application Ser. No. 09/844,818 (now U.S. Pat. No. 6,539,725) filed Apr. 27, 2001, which related to and claims the benefit of the filing date of prior filed U.S. Provisional Patent Application No. 60/267,657, filed Feb. 9, 2001.

BACKGROUND OF THE INVENTION

1. Field of the Invention

The present invention relates to the field of power generation using thermoelectric devices.

2. Description of the Related Art

Although it has long been understood that thermoelectric devices can be used to generate power, thermoelectric power generation has been little utilized because the efficiency of present generator design and the power density of such generators are too low.

Historically, solid-state electrical power generating systems are constructed from TE Modules or stand-alone TE elements placed between a source of heat and a heat sink. The parts are designed with no moving parts in the power generator. Generally, systems that use hot and cold working fluids as the hot and cold sources employ fans or pumps to transport the fluids to the assembly.

In other applications, pressurized air and fuel are combusted within the generator. Still in other applications, such as automotive exhaust waste power converters, heat is transported to the generator by the exhaust system. In these devices, the waste heat is removed either by external fans supplying coolant or by free convection through finned radiators.

In applications such as generators that employ nuclear isotopes as the heat source, individual TE elements are configured to produce electrical power. Each TE element is attached to an isotope heat source on the hot side, and to a waste heat radiator on the cold side. No parts move during operation.

Texts that describe solid-state TE power generation are either written contemplating spacecraft usage (Angrist, Stanley W., *Direct Energy Conversion*, Third Edition, Allyn and Bacon, Inc. (Boston, 1976). Chapter 4, pp. 140-165) have been concerned with terrestrial applications for which reliability rather than efficiency has been the primary goal or have used formulaic models (Ikoma, K. et al., "Thermoelectric Module and Generator for Gasoline Engine Vehicles," 17th International Conference on Thermoelectrics, Nagoya, Japan, (1998), pp. 464-467) that do not necessarily optimize system performances for today's applications. The need exists to develop and use TE power generation cycles for current and future applications including waste heat recovery from vehicle exhaust and engine coolant, from industrial waste process heat, and from co-generation systems that benefit from electrical power production.

SUMMARY OF THE INVENTION

New heterostructure thermoelectric, quantum tunneling, very thin plated, and deposited thermoelectric materials operate at substantially higher power densities than typical of the previous bulk materials and offer the potential for higher system efficiency. In addition, recent advancements in thermoelectric (TE) material and systems have renewed interest in the potential use of TEs for power generation. The inherent qualities of TE systems, few if any moving parts, quiet operation and the prospects of both environmental friendliness and waste power recovery have increased further the interest.

Successful operation of thermoelectric devices with high power density requires high heat transfer rates both on the cold and hot side of TE Modules. One way to achieve this is through rotary designs that lend themselves to high fluid flow rates, and hence, high thermal power throughput. In one preferred embodiment, rotary systems in which a portion of the heat exchanger acts as fan blades, and thereby contributes to working fluid flow, can reduce power into the fan, simplify system design and reduce size.

Further, the heat transfer rate in many systems can be increased by employing heat pipes, as is well known to the art. Such devices use two-phase (liquid and vapor) flow to transport heat content from one surface to another. Where heat is to be removed at a heat source surface, the fluids' heat of vaporization is utilized to extract thermal power. The vapor flows to a surface at a lower temperature at the heat sink side where it condenses and thus gives up its heat of vaporization. The condensed fluid returns to the heat source side by capillary action and/or gravity.

Properly designed heat pipes are very efficient and transport large thermal fluxes with very low temperature differential. Some keys to efficient operation are that the liquid return process be efficient and that the entire heat source side be wetted at all times, to make liquid always available to evaporate and carry away thermal power. Similarly, it is important that the cool, sink side does not accumulate liquid since heat pipe working fluids are usually relatively poor thermal conductors. Thus, the sink side should shed liquid efficiently, to maintain effective surface thermal conductivity.

Power generators that are combined with thermal isolation as described in U.S. patent application Ser. No. 09/844,818, entitled Improved Efficiency Thermoelectrics Utilizing Thermal Isolation can further increase performance.

One aspect of the present disclosure involves a thermoelectric power generation system having a plurality of thermoelectric elements forming an assembly having a cooler side and a hotter side during operation. A working media collects waste heat from the colder side of at least some of the plurality of thermoelectric elements. After collecting the waste heat, the working media is further heated and then dispenses at least a portion of its heat to the hotter side of at least some of the plurality of thermoelectric elements, thereby generating power with at least some of the plurality of thermoelectric elements. Preferably, at least one electrical system transfers the power from said assembly, and a controller is provided to optimize or otherwise control operation for the particular desired application.

In one embodiment, the working fluid is heated from a source of heat, such as solar, combustion, isotopes and others. In one embodiment, the working media is solid, a fluid, or a combination of solid and fluid material.

In one embodiment, at least some of the plurality of thermoelectric elements are configured to allow the working media to pass through them, such as being porous or having holes. In this embodiment, preferably, heat is convected by the working media in the direction of the hotter side of the thermoelectric elements.

In another embodiment, a plurality of heat exchangers are in thermal communication with at least some of the thermoelectric elements. Preferably, at least some of the heat exchangers are thermally isolated in a direction of working media movement.

In yet another embodiment, at least one of the plurality of thermoelectric elements is configured to allow convective heat transport by the working media in the direction of the hotter side of the thermoelectric element, and at least a plurality of others of the thermoelectric elements are configured to provide thermal isolation in a direction of working media movement.

Another aspect of the present disclosure involves a method of generating power with a thermoelectric, the method involves a number of steps. A working media is moved in a manner to thermally interact with a plurality of thermoelectric elements forming an assembly having a cooler side and a hotter side during operation. Heat is transferred to the working media from the cooler side of at least some of the plurality of thermoelectric elements, and then additional heat is added to the working media. Heat is then dispensed from the working media to the hotter side of at least some of the plurality of thermoelectric elements, to thereby generate power with at least some of the plurality of thermoelectric elements.

In one embodiment, the additional heat is added by combusting the working media, providing solar heating, using isotope, using waste heat from another process, or some combination of these and other heat sources. In another embodiment, heat is convected by the working media through at least one thermoelectric element in the direction of the hotter side of the thermoelectric elements.

Preferably, the method further involves controlling the power generation to match a criterion, such as maximum efficiency, maximum peak power output, some combination or some other criterion for the particular application. For example, the speed of the working media may be controlled in order to optimize a parameter of operation, such as efficiency.

These and other aspects and benefits of the present description will be apparent from the more detailed description of the preferred embodiments below.

BRIEF DESCRIPTION OF THE DRAWINGS

FIGS. 1B-1G depict a general arrangement of a thermoelectric generator that hot and cold fluids a motor and heat exchanger fins to create a temperature differential across a TE Module. Electrical power is produced from the thermal power within the hot side fluid stream.

FIG. 2A depicts a TE Module, heat pipes and heat exchanger assembly for generally axial fluid flow in a rotary solid-state power generator.

FIG. 2B gives a detailed cross sectional view of the assembly of FIG. 2A.

FIG. 2C gives a second view of a segment of the assembly of FIG. 2A.

FIG. 3A depicts a sectional view of a TE Module, heat pipes and heat exchanger assembly for generally radial fluid flow in a rotary power generator.

FIG. 3B shows a detailed, cross-sectional view of the assembly of FIG. 3A.

FIG. 15A depicts a co-generation power generator that employs both a convective and thermal isolation.

DETAILED DESCRIPTION OF THE PREFERRED EMBODIMENT

Power generators are disclosed using new thermodynamic cycles where waste heat from the TEs can be recycled to the hotter side along with added heat. Also disclosed are ways to combine combustion with a TE power generator. Emphasis is placed on factors that influence efficiency, including the effects of hot side and cold side conditions that increase efficiency when used with the new thermodynamic cycles. (Bell, L. E., "Use of Thermal Isolation to Improve Thermoelectric System Operating Efficiency," *Proceedings 21$^{st}$ International Conference on Thermoelectrics*, Long Beach, Calif., August 2002 and Bell, L. E., "Increased Thermoelectric System Thermodynamic Efficiency by Use of Convective Heat Transport," *Proceedings 21$^{st}$ International Conference on Thermoelectrics*, Long Beach, Calif., August 2002). The source of thermal power (heat) is of special benefit when used for power generation in systems where the available means of eliminating waste heat from the cold side influence strongly system efficiency.

These designs also have important application in several related solid-state power generation technologies, including thermionic, photonic, magnetocaloric as well as thermoelectric power converters.

The following background concepts as described in detail in the referenced patent application or patent, each of which is incorporated by reference herein, particularly (1) convective TE power generation and go-generation (U.S. Pat. No. 6,598,405); (2) isolated element TE systems (U.S. Pat. No. 6,539,725); (3) isolated element stack designs and high power density designs (U.S. patent application Ser. No. 10/227,398 filed Aug. 23, 2002).

In the context of this description, the term Thermoelectric Module, TE Module, TE Element, or TE are used in the broad sense of their ordinary and customary meaning, which is (1) conventional thermoelectric converters, such as those produced by Hi Z Technologies, Inc. of San Diego, Calif., (2) quantum tunneling converters (3) thermionic converters, (4) magneto caloric modules, (5) elements utilizing one, or any by combination of, thermoelectric, magneto caloric, quantum, tunneling and thermionic effects, (6) any combination, array, assembly and other structure of (1) through (6) above.

In this description, the words cold, hot, cooler, hotter and the like are relative terms, and do not signify a temperature range. For instance, the cold side heat exchanger may actually be very hot to the human touch, but still cooler than the hot side. These terms are merely used to signify that a temperature gradient exists across the TE Module.

In addition, the embodiments described in this application are merely examples, and are not restrictive to the invention, which is as defined in the claims.

Figure 1A:
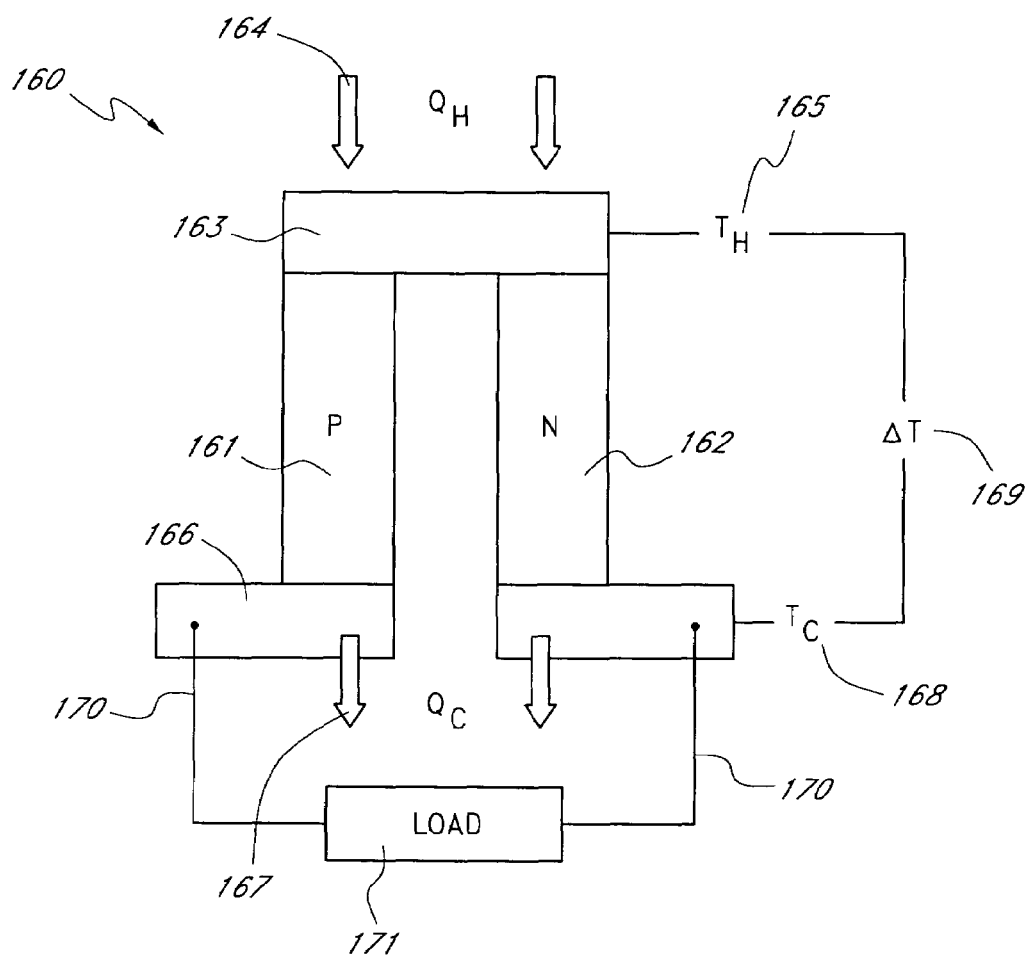
FIG. 1A depicts components of a traditional TE generator.

The basic theoretical operation of a TE power generator can be further understood by referring to FIG. 1A. One or more TE elements 161 and 162 are placed in good thermal contact with a source of thermal power $Q_H$ 164 at one end and first and second heat sinks 166 to remove waste heat $Q_C$ 167 at the other end. The thermal power source 164 at temperature $T_H$ 165 is hotter than the heat sinks 166 at temperature $T_C$ 168. Due to the temperature difference $\Delta T$ 169, thermal power flows from the thermal power source 164 to the heat sinks 166. A fraction of the thermal power can be converted to electrical power by suitable TEs 161, 162.

The efficiency of energy conversion $\phi$ is equal to the output load, 171, divided by the thermal input power $Q_H$, 164.

$$\phi = \frac{\text{Load}}{Q_H} \tag{1}$$

The efficiency can also be written as;

$$\phi = \left(\frac{T_H - T_C}{T_H}\right)\eta_{GT} \tag{2}$$

The first term on the right hand side in parenthesis is the Carnot cycle efficiency and is the maximum obtainable efficiency according to the second law of thermodynamics. The second term $\eta_{GT}$ is the efficiency factor for a particular conversion process (and is less than 1). These properties of the generator apply whether it is thermionic, thermoelectric (in a narrow sense), photonic, quantum tunneling, magneto caloric, or any combination thereof. The factor $\eta_{GT}$ represents the characteristic performance of a particular type of generator. The subscript "GT" is used to represent "generator type." For example, "GT" is replaced by "TE" to denote the form $\eta_{TE}$ takes for a thermoelectric (in a narrow sense) material system. In which case the theoretical optimum efficiency value excluding losses is;

$$\eta_{TE} = \frac{1}{1 + \frac{2(1 + \sqrt{1 + ZT_{AVE}})}{ZT_H}} \tag{3}$$

where;

$$Z = \frac{\alpha^2}{\rho\lambda} \tag{4}$$

$$T_{AVE} = \frac{T_C + T_H}{2} \tag{5}$$

(6) α=material systems net Seebeck Coefficient (7) ρ=material systems average electrical resistance (8) λ=material systems average thermal conductivity This is a well-known result that is described in more detail in Angrist, Stanley W., *Direct Energy Conversion*, Third Edition, Allyn and Bacon, Inc. (Boston, 1976). Chapter 4, pp. 140-165).

Generally, it is desirable to optimize either the efficiency or power output of a generator. For brevity, thermoelectric systems and their operation at high efficiency as described. Nevertheless, the discussion applies to operation under other conditions and more generally, to other TE systems as well.

Figure 1C:
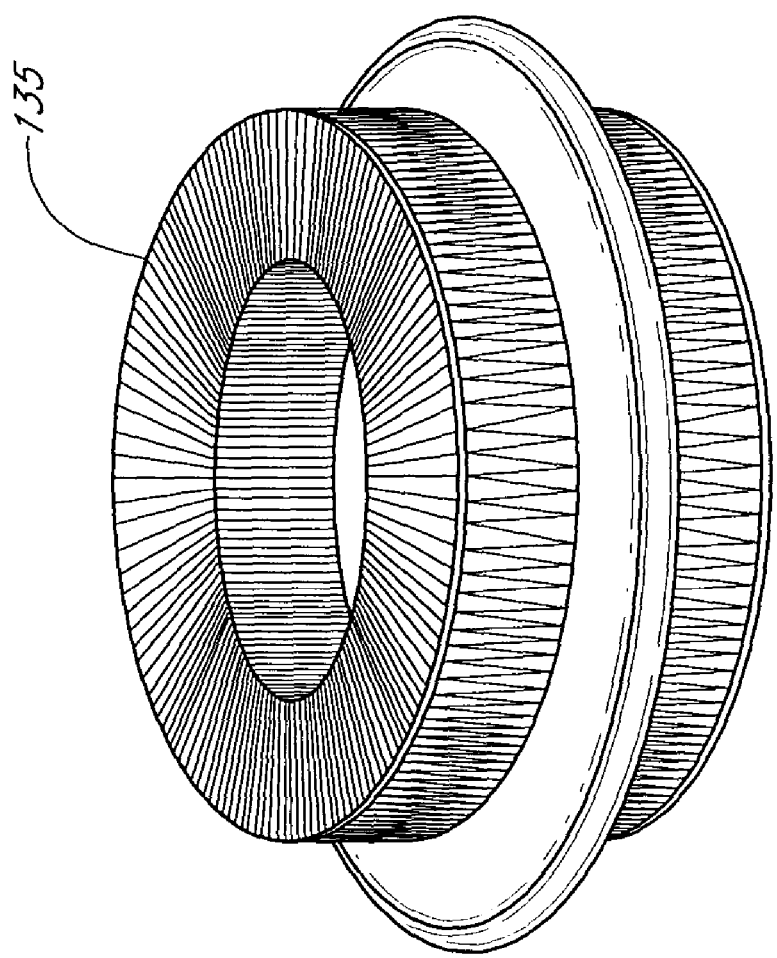
Figure 1D:
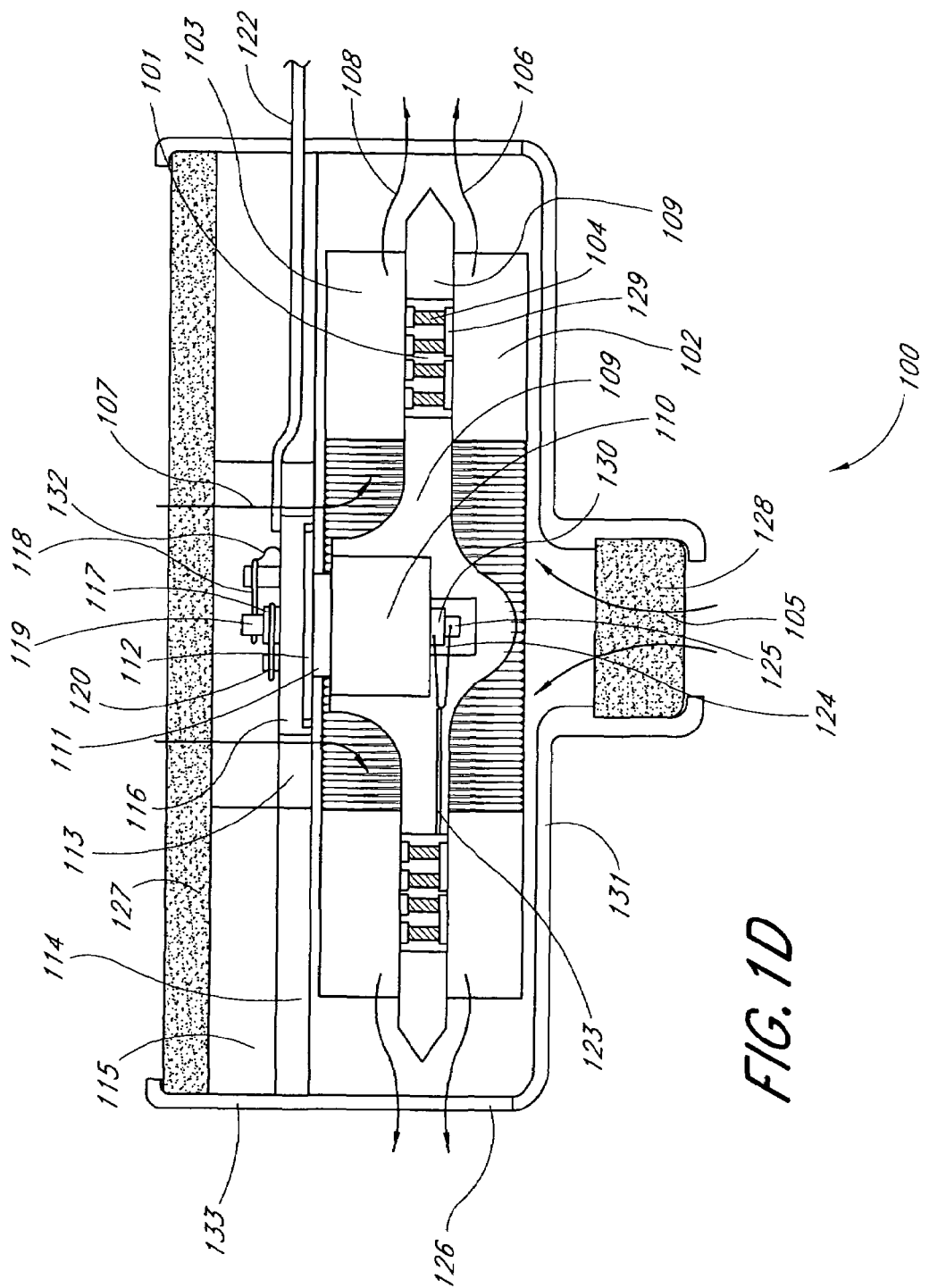
Figure 1E:
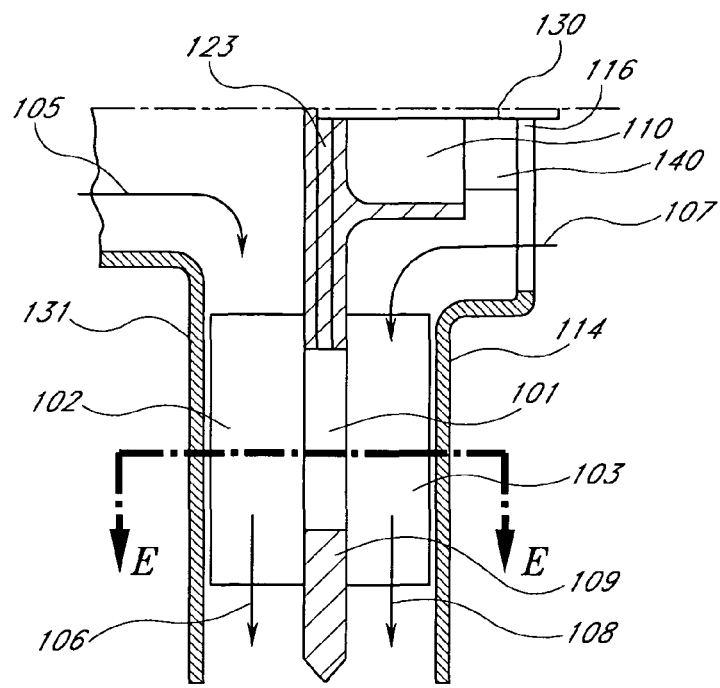
Figure 1F:
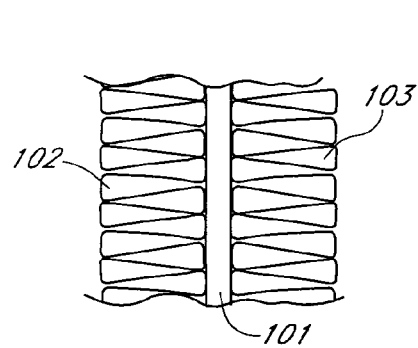
Figure 1G:
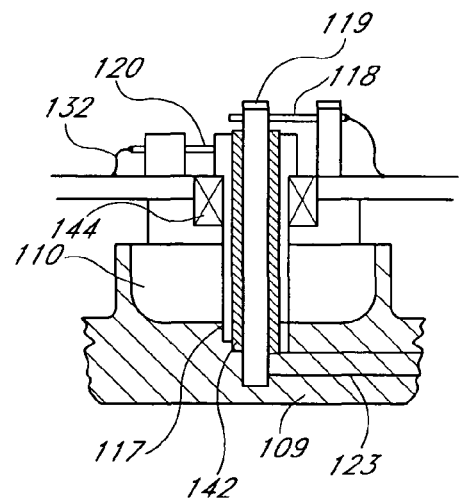

FIGS. 1B-1G depict a general arrangements for a rotary thermoelectric power generator 100. FIG. 1B is a perspective view. FIG. 1C is a view of a rotor assembly 135 as visible through the slots 126 of FIG. 1B. FIG. 1D is a cross section through the rotary thermoelectric power generator 100. FIGS. 1E-1G provide additional detail for various portions of the generator. A rotor assembly 135 (best seen in FIGS. 1C and 1D) is comprised of TE Module 101, in good thermal contact with hot side heat exchanger 102, such as heat transfer fins, on one side and a cold side heat exchanger 103, such as heat transfer fins, on the other. Insulation 109 separate hot and cold sides. Insulation 109 rigidly connects the rotor parts to a motor rotor 110. The TE Module 101 is depicted here for explanatory purposes and is comprised of TE elements 104 and circuitry 129. At contact points 124, 125, wires 123 electrically connect TE Module 101 to portions 117, 119 of shaft assembly 130 that are electrically isolated from each other, TE Module 101, hot side heat exchanger 102, cold side heat exchanger 103, insulation 107, 109, wiring 123, circuitry 129 and shaft portions 117, 119 all form a rigid rotatable unit.

Motor assembly 111 is connected to motor rotor 110 by bearings 144 (FIG. 1G). Slip ring contact 118 is in electrical communication with shaft member 119, and slip ring contact 120 is in electrical communication with shaft member 117. Wiring 122 connects to slip ring contacts 118 and 120 through circuitry 132 and other circuitry not shown, such as traces on a circuit board or other conventional circuit connections. Wiring 122 also connects to motor assembly 111, through a circuit board 112 and other circuitry not shown.

Spokes 113 (best seen in FIG. 1B) mechanically attach inner wall 114 (of FIG. 1D) to motor base 116 and thereby to the motor assembly 111. Hot side fluid filter 128 is attached to outer housing 131, and cold side fluid filter 127 is supported by vanes 115 and attached to an extension 133 of outer housing 131. Openings 126 in the outer housing, such as slots, allow fluid 106, 108 passage through outer housing 131. A hot working fluid 105, 106 (FIGS. 1D and 1E) is confined to a chamber defined by outer wall 131, openings 126, insulation 109, filter 128 and TE Module 101. Cold working fluid 107, 108 is confined by inner wall 114, vanes 115, outer housing extension 133, motor base 116 and filter 127.

Hot fluid 105 passes through the hot side filter 128 and transfers heat to the hot side heat exchanger 102. The interface between the hot side heat exchanger 102 and TE Module 101 is thus heated. Similarly, cold fluid 107 passes through cold side filter 127 and absorbs heat from cold side heat exchanger 103. Thus, the interface between the cold side heat exchanger 103 and TE Module 101 is cooled. The temperature gradient (heat flow) across the TE Module 101 generates electrical power. The electrical power is transferred through wires 123, to conduct points 124, 125, to shaft portions 117, 118 and through slip ring contacts 118, 120 and to wires 122 (best seen in FIG. 1G).

Motor assembly 111 acting on motor rotor 110 spins the rotor assembly. In one embodiment, the heat exchangers 102, 103 are configured as fins oriented longitudinally away from the axis of rotation of the rotor assembly. In this configuration, the heat exchangers 102, 103 advantageously act as fan blades of a centrifugal fan or blower and thereby continuously pump working fluids 105, 107 in order to maintain a temperature differential across TE Module 101. A portion of the heat flow across TE Module 101 is continuously converted to electrical power. Hot working fluid 105 is cooled as it passes through the hot side heat exchanger 102 and exits as waste fluid 106 through openings 126. Similarly, cold working fluid 107 is heated as it passes through cold side heat exchanger 103 and exits as waste fluid 108 through openings 126.

The benefits of this rotational thermoelectric power generator will be explained in detail with specific configurations for the rotary assembly 135 in the following figures. The rotation of the heat exchanger thermoelectric module as a unit allows one or more heat exchangers to be used as fan blades for pumping the working fluid. In addition, other benefits and uses for rotation may be obtained in increasing the efficiency of the power generation system and increasing power density, as further explained below.

FIG. 1E depicts a closer view of cold and hot side working fluid movements for the power generator 100. The TE Module 101 is in good thermal communication with the hot side heat exchanger 102 and a cold side heat exchanger 103. The two sides are separated by insulation 109. Hot side fluid 105 and 106 is contained by an outer wall 131 and insulation 109. Similarly, cold side fluid 107, 108 is contained by the inner wall duct 114 and insulation 109. Motor rotor 110 is rigidly attached to insulation 109 so that insulation 109, TE Module 101 and heat exchangers 102, 103 move as a unit. Wires 123 connect TE Module 101 to rotary slip rings 118, 120 as described in more detail in the discussion of FIG. 1G. Motor rotor 110 is connected through bearings 144 (FIG. 1G) to motor driver 140 and shaft 130 (shown in detail in FIG. 1G). Electrical wires 123 connect to TE Module 101 and shaft 130.

A temperature gradient is produced across TE Module 101 by hot fluid 105 heating heat exchanger 102 and cool fluid 107, cooling heat exchanger 103. Hot fluid 105 cools and exits and cool fluid 107 is heated and exits. The movement of hot fluid 105 is created by the rotation of heat exchanger 102 componentry which act as vanes of a blower or radial fan. Motor rotor 110 and motor driver 140 produce the rotation. Fluid flow is guided by the outer housings and the insulation.

FIG. 1F shows a cross section of TE Module 101 and heat exchangers 102, 103. Heat exchangers 102, 103 are shown as folded fins as is known to the art, but may be of any other suitable heat exchanger design, as an example, any advantageous designs found in Kays, William M., and London, Alexander L., *Compact Heat Exchangers*, 3rd *Edition*, 1984, McGraw-Hill, Inc. Heat pipes and any other technology may be incorporated to enhance heat transfer.

FIG. 1G illustrates additional details of an embodiment of a slip ring assembly for transferring the electric power created TE Module 101 to external systems. The assembly consists of wires 123 in insulation 109, one of which is electrically connected to inner shaft 119, and a second to outer shaft 117. Electrical insulation 142 mechanically connects inner and outer shafts 117, 119. Advantageously, outer shaft 119 is mechanically connected to motor rotor 110 and bearing 144. Slip ring contact 118 is electrically connected to inner shaft 119 and slip ring contact 120 is electrically connected to outer shaft 117.

Figure 1H:
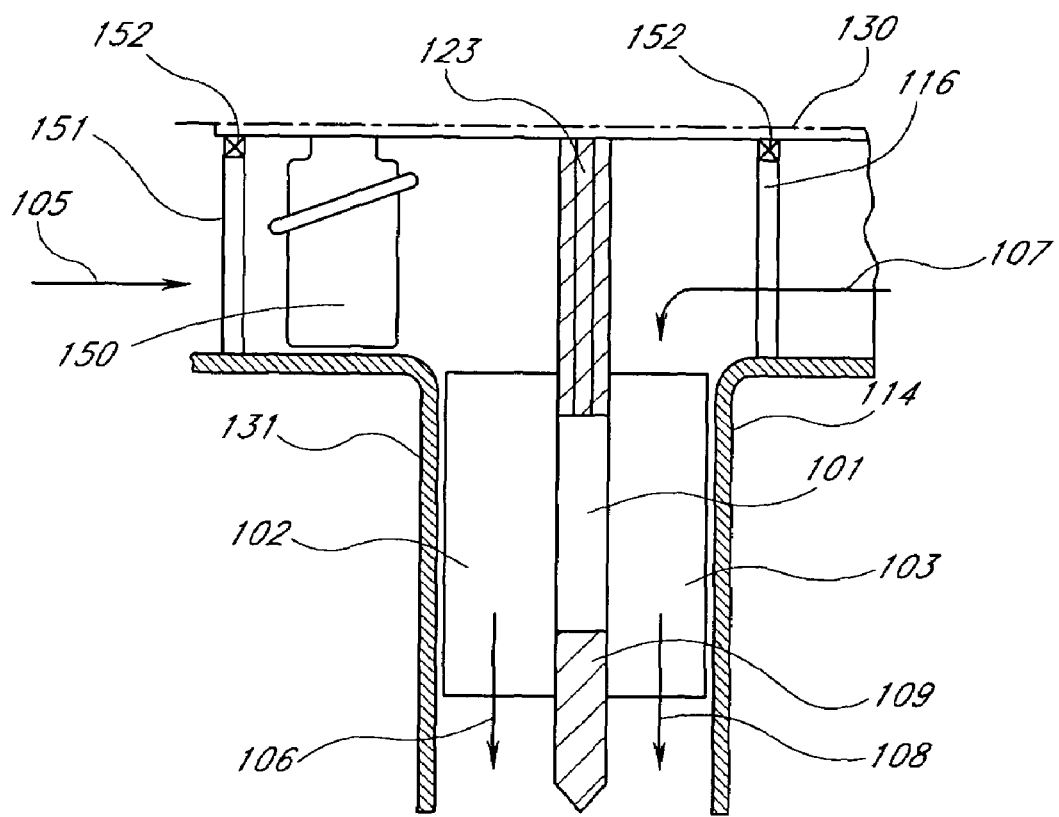
FIG. 1H further depicts a general arrangement of a thermoelectric generator in which the flow and pressure of a working fluid spins the generator assembly, thus eliminating the need for the electric motor shown in FIGS. 1C and 1D.

FIG. 1H depicts an alternate configuration of a thermoelectric generator that uses flow and pressure of a working fluid to spin the generator assembly, thus eliminating the need for the electric motor shown in FIGS. 1D and 1E.

As depicted in FIG. 1H, the TE 101, heat exchangers 102, 103 and related parts comprising the rotatable parts of the thermoelectric generator are as identified in FIG. 1E, except that a fan 150 and insulation 109 are attached to form a rotatable unit. Bearings 152, shaft 130, and spokes 116, 151 form the suspension for the rotatable parts.

In operation, working fluid 105 propels fan 150. Power from the fan spins the rotatable parts. In this embodiment, the rotation acts to draw in cold working fluid 107, as well as provide other benefits from rotation discussed in the description of FIGS. 2-7 and 9.

The fan 150 is shown as a separate part. The same function can be achieved by using other designs that have heat exchangers or yet other parts shaped and positioned as to utilize power available in the hotter, colder and/or exhaust fluid streams to cause rotation. For Example, such a system could be used in the exhaust stream of a combustion engine, such as with an automobile. In such an example, what would otherwise simply be waste heat, is converted to electricity, and the exhaust flow spins the rotary thermoelectric assembly.

Motor rotor 110, insulators 109, 142, and shafts 117, 119 rotate as a unit and are supported by bearing 144. Slip rings 118, 120 transmit the electrical power produced within the rotating unit to an external electrical circuit. The slip rings 118, 120 can be of any design known to the art, and the shafts 117, 119 can be of any viable configuration that are conductive or contain conductive wires or members. The electrical power transmission parts and configuration can be of any design that conveys power from the rotating unit to external circuitry.

It should be understood that although FIGS. 1D-1G depict a single rotary assembly, multiple rotary assemblies are also contemplated.

FIG. 2A depicts a cross-sectional view of rotor assembly 200 for a thermoelectric power generator of the form illustrated generally in FIG. 1. The rotor assembly 200 consists of a ring-shaped TE Module 201 in good thermal contact with a circular array of outer heat pipes 202 and a circular array of inner heat pipes 203. A hot side heat exchanger 204 is in good thermal contact with outer heat pipes 202, and a cold side heat exchanger 205 is in good thermal contact with inner heat pipes 203. The rotor assembly 200 is generally symmetrical about its axis of rotation 211.

In operation, the rotor assembly 200 spins about its axis of rotation 211. Hot fluid (not shown) is in contact with the hot side heat exchanger 204, which transfers heat flux to the outer heat pipes 202, and to the outer surface of the TE Module 201. A portion of the heat flux is converted to electrical power by the TE Module 201. The waste heat flux passes through the inner heat pipes 203, then to the cool side heat exchanger 205 and finally to a cooling fluid (not shown) in contact with the cool side heat exchanger 205.

FIG. 2B presents a more detailed view of a cross-section of rotor assembly 200 through a heat pipe. As in FIG. 2A, the heat pipes 202 and 203 are in thermal contact with TE Module 201. The TE elements 208 and electrical circuitry 209 complete the TE Module 201. In one preferred embodiment, the heat pipes 202, 203 are comprised of sealed shells 214, 215 containing a heat transfer fluid. In operation, while the rotor assembly 200 spins about the axis 211, the rotational forces push a liquid phase of heat transfer fluid away from the axis of rotation of the particular heat pipes 202, 203. The direction of the outward force induced by rotation is shown by arrow 210. For example, in the heat pipe 202, a liquid phase 206 forms an interface 212 with the vapor phase. The hot side heat exchanger 204 is in good thermal contact with the hot side heat pipe shell 214. Similarly, the cool side heat pipes 203, 215, have heat transfer fluid 207 in a liquid phase and an interface 213 with the vapor phase. The cooler side heat exchanger 205 is in good thermal communication with the cool side heat pipe shells 215.

The outward force 210 induced by rotor assembly 200 rotation acts to force the liquid phases 206 and 207 to the positions shown in FIG. 2B. Hot gas (not shown) transfers heat from the outer heat exchanger fins 204 to outer heat pipe shells 214. The heat flux causes a portion of the liquid phase 206 on the hot side to vaporize. The vapor moves inward in the opposite direction to that indicated by arrow 210, since it is displaced by denser liquid phase 206. Vapor phase fluid in heat pipes 202 in contact with the interface of TE Module 201 and hot side heat pipe shells 214 transfers a portion of its heat content to the TE Module 201, and condenses to the liquid phase. The rotation-induced force drives the dense liquid-phase in the direction indicated by the arrow 210. The fluid cycle repeats as more heat is absorbed by the hot side heat exchanger 204, transferred to the outer heat pipe shells 214, and then to the outer surface of TE Module 201.

Similarly, waste heat from the inner side of TE Module 201 causes the liquid phase 207 of the inner heat pipe fluid to boil and be convected inward to the inner portions of the inner heat pipe shells 215. The cold working fluid (not shown) removes heat from the cooler side heat exchanger 205, and adjacent portions of cooler side heat pipe shells 215. This causes condensation of the fluid 207. The liquid phase is driven by centrifugal force in the direction indicated by the arrow 210, and accumulates against the TE Module 201 and the inner heat pipe shells 215 interface. This cycle constantly repeats, with the fluid constantly evaporating at one location, condensing at another, and being transported back to the first by centrifugal force.

The forces produced by the rotor assembly 201 rotation can be several times to thousands of times that of gravity, depending on rotor dimensions and rotational speed. such centrifugal forces can enhance heat pipe heat transfer, thus allowing the rotor assembly 200 to operate with less heat transfer losses and at higher heat fluxes.

FIG. 2C shows a sectional view of the rotor assembly 200 of FIG. 2A viewed along the axis of rotation 211. The TE Module 201 is in good thermal contact with the outer heat pipes 202 and the inner heat pipes 203. The heat exchangers 204, 205, such as fins as shown, are in good thermal contact with the heat pipes 202, 203.

FIG. 2C shows individual heat pipe segments 202, 203 and the TE Module 201. The hot working fluid (not shown) flows through passages 216 between the outer heat exchanger fins 204 and the outer heat pipes 202. Similarly, the cold working fluid (not shown) flows through the inner passages 217 between the inner heat exchanger fins 205 and the inner heat pipes 203.

FIG. 3 depicts an alternative thermoelectric power generator rotor assembly 300, in which, working fluids flow in a generally radial direction. The cross section view shows a disk-shaped TE Module 301 in good thermal contact with hot side heat pipes 302 and cold side heat pipes 303. In good thermal contact with the hot side heat pipes 302 is a heat exchanger 304, and with the cooler side heat pipes 303 is a cool side heat exchanger 305. The rotor assembly 300 rotates about and is generally symmetrical about a centerline 310.

In operation, the rotor assembly 300 spins about the centerline 310, driven by a motor such as in FIG. 1A. Hot working fluid (not shown) passing generally radially outward between the hot side heat exchanger 304 (fins in this depiction) and the hot side heat pipes 302, transfers heat to the heat exchanger 304 and the outer heat pipes 302 and then to the TE Module 301. Similarly, cold working fluid (not shown) passing generally radially outward through the center side heat exchanger 303 and the cooler side heat pipes 305 removes heat convected by the cooler side heat pipes 303 from the TE Module 301. A portion of the thermal flux passing from the hotter side heat pipes 304 to the TE Module 301 and out through the cooler side heat pipes 305 is converted by TE Module 301 to electric power.

Rotation of the heat pipes 302, 303 (configured as flattened tubular sections in this embodiment) advantageously act as fan blades that pump hot and cold working fluids (not shown) outward. Advantageously, the heat exchangers 304, 305 and the heat pipes 302, 303 are configured to maximize both heat transfer and fan fluid pumping action. Thus, the rotor assembly 300 functions both as the power generator and working fluid pump.

FIG. 3B shows a more detailed, cross-sectional view 311 through a heat pipe of the rotor assembly 300 depicted in FIG. 3A. The TE Module 301 is comprised of TE elements 309 and circuitry 310. The TE Module 301 is in good thermal contact with heat pipes 302, 303. As with the FIG. 2 configuration, the hotter side heat pipes 302 are comprised of sealed shells 312 with a fluid having a liquid phase 306 and vapor phase, with an interface 314. Similarly, the cooler side heat pipes 303 are comprised of sealed shells 313, containing fluid with liquid phase 307 and vapor phase, with an interface 315. The heat exchanger fins 304, 305 are in good thermal communication with the heat pipes 302, 303. An arrow 308 points in the direction of an outward force generated as the rotary assembly rotates about the axis 310.

In operation, the outward forces push the liquid phases 306, 307 of the heat transfer fluids within the heat pipes 302, 303 outward, forming the liquid phases 306, 307 and the interfaces 314 and 315. Heat flux from the hot side working fluid (not shown) flowing past the hot side heat exchanger 304 evaporates portions of the fluid 306, which condenses at the hotter side heat pipe shells 312 at the TE Module 301 interface. Similarly, a portion of the heat flux passes through the TE Module 301 to its interface with cooler side heat pipe shells 313, and into the cooler side heat pipe fluid 307, causing the fluid 307 to boil. The vapor phase condenses on the inner portion of the cool side heat pipe shell 313 as heat is removed by transfer to the cooler side heat exchanger 305, and to the cooler side working fluid (not shown). This heat transfer process is analogous to that described in more detail in the descriptions of FIGS. 2A, 2B and 2C.

Figure 4:
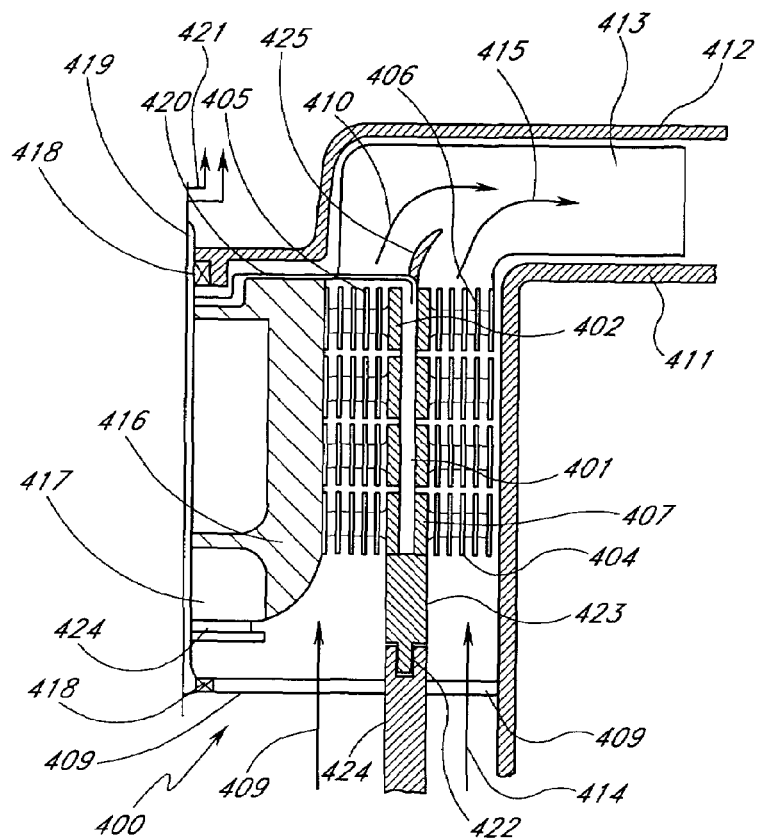
FIG. 4 depicts an axial flow power generator wherein the hot and cold fluids flow generally parallel to one another in the same general direction. The generator utilizes thermal isolation and heat pipes to improve energy conversion efficiency.

FIG. 4 depicts one side of another rotating power generator 400 in cross-section. A TE Module 401 is connected thermally to a cooler side heat exchanger 402 and a hotter side heat exchanger 403. In the depicted embodiment, the cooler side heat exchanger 402 has segments of heat pipes 404 and fins 406. Similarly, hotter side heat exchanger 403 has segments of heat pipes 405 and fins 407. A cooler working fluid 408, 410 is confined to a chamber formed by insulators 416, 423, 424 and a duct 412. Similarly, a hotter working fluid 414 and 415 is confined by the insulators 423, 424 and an outer duct 411. Rotor insulation 416 is connected rigidly to a motor rotor 417, the inner portion of the exchanger 402, and thereby to the TE Module 401 and heat exchanger 403. Wires 420 and a shroud 425 are connected rigidly to the TE Module 401. Similarly, a fan blade assembly 413 is rigidly attached to the TE Module 401. A shaft assembly 419 is attached to the motor rotor 417, and to bearings 418. A slip ring assembly 421 is in electrical communication to a shaft assembly 419. The insulators 423 and 424 are configured to form a labyrinth seal 422. Spokes 409 connect the left most bearing 418 to insulation 424 and to duct 411.

The assembly formed by the motor rotor 417, the insulators 416, 423, the heat pipes 402, 403, the TE Module 401, the fan blades 413, the wires 420, the shaft 419 and the shroud 425 rotate as a unit. Rotation of the fan blades 413 provides motive force for the hot and the cold working fluids 408, 410, 414, 415.

The hot working fluid 414 enters from the left and transfers thermal energy to the hot side heat exchanger 402 and then, to TE Module 401. The flow of the hot working fluid 414 is driven by the rotation of the fan blades 413. Similarly, the cooler working fluid 408 enters from the left and extracts waste thermal energy from the cooler side heat exchanger 403 and the TE Module 401. The electrical power created passes through the wires 420 and out of the rotating portion through the shaft assembly 419 and the slip ring assembly 421, as was described in more detail in the discussion of FIGS. 1F.

The heat pipes 402, 403 are segmented to thermally isolate one portion from another for the purposes taught in U.S. Pat. No. 6,539,725 filed Apr. 27, 2001, entitled Efficiency Thermoelectrics Utilizing Thermal Isolation, which application is incorporated by reference herein. Heat transfer within the heat pipes 402, 403 is enhanced by the centrifugal acceleration as discussed above, and thereby, increases efficiency of thermal power transport and the allowable power density at which the system can operate. By utilizing centrifugal force to enhance the heat transfer, the overall device can be more compact and employ thermoelectric materials that advantageously operate at high thermal power densities.

The seal 422 is representative of any seal configuration that suitably separates hot fluid 414 from cold fluid 408 with a moving to stationary boundary. In some configurations, the pumping power of the fan 413 in combination with the inlet geometry may negate the need for the seal 422. Alternately, seal 422 may serve the function of providing separation of the hotter and cooler working fluids 408, 422 if an external, alternate mechanism (not shown) to fan blades 413 provides the force to pump the working fluids 408, 422 through the heat exchangers 402, 403. In such an embodiment, the fan 413 may be omitted or its function supplemented by an alternate fluid pump mechanism.

Figure 5:
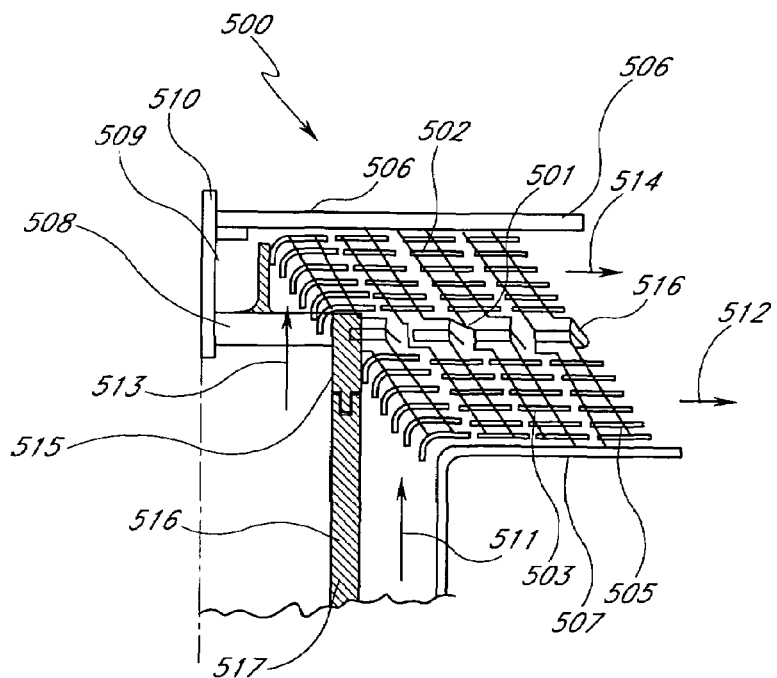
FIG. 5 depicts a radial flow power generator wherein the hot and cold fluids flow generally parallel to each other in the same direction. The generator utilizes thermal isolation and heat pipes to improve efficiency.

FIG. 5 depicts a power generator configuration in which the heat exchangers act as fan blades. The TE Module and heat exchanger are similar in concept to the configuration depicted in FIG. 3. The rotor assembly 500 consists of TE Modules 501, cooler fluid heat exchanger 502, a hotter fluid heat exchanger 503, insulation 515, 517, spokes 508 and a motor rotor 509, all of which are connected rigidly to one another to form a rigid unit that rotates about a shaft 510. The cooler fluid heat exchanger 502 has heat pipes in good thermal contact with fins 504. Similarly, the hotter fluids heat exchanger 503 has heat pipes in good thermal contact with fins 505. Insulation 515, 517 and a duct 507 form a chamber that confines a hotter working fluid 511, 512. Similarly, insulation 515, 517 and a duct 506 form a chamber, which confines a cooler working fluid 513, 514. A seal 516 is formed in the insulation 515, 517 to separate the hotter 511 and the colder working 513 fluids.

The assembly 500 operates by the motor rotor 509 providing motive force to rotate the heat exchangers 502, 503, which, in turn, creates a pumping action to pull hot and cold fluid through the heat exchangers 502, 503 to produce a temperature gradient across the TE Module 501. Electrical power generated thereby is extracted and transferred to external circuitry by the design shown in FIGS. 1A-1E, or by any other transfer method acceptable in the environment.

Advantageously, several working fluids may be used within a single assembly. A generator such as that of FIG. 4 may have several sources of hot side working fluids each with a different composition and/or temperature. This condition can arise, for example, with waste electrical power generation systems that have several sources of exhaust gas to be processed with waste heated fluid from a boiler, dryer or the like. Such multiple sources of working fluids may be introduced through wall 411 at a position along the axis of rotation where the hot side working fluid 422 has been cooled to a temperature that when combined with an added working fluid, advantageously generates electrical power. In this circumstance, the heat flux may vary in some of the heat pipes 402, 407 and fins 405, 409 so that TE Modules 101, heat pipes 402, 207 and fins 405, 409 may differ in their construction, size, shape, and/or materials from one section to the next in the direction of fluid flow. Also, insulation and fin structure can be used to separate different fluids. Finally, more than one cold side working fluid 409, 410 can be utilized in combination with at least one hot side working fluid.

Figure 6:
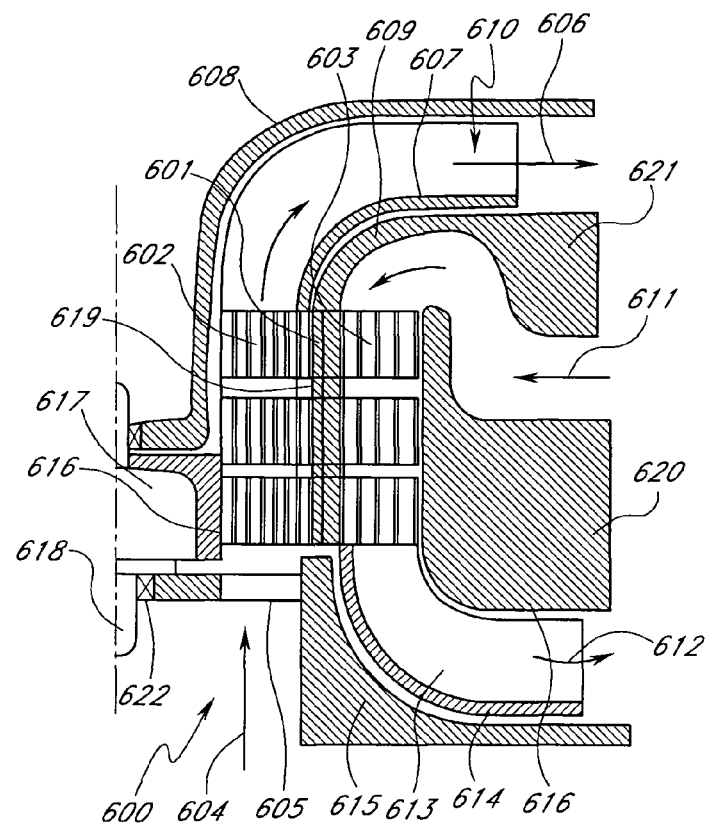
FIG. 6 depicts an axial flow generator with hot and cold fluids flowing in generally opposite directions to one another. Advantageously, the TE Modules and heat exchangers are thermally isolated to improve efficiency and increase power density.

The design of FIG. 6 also utilizes heat pipes as described in FIG. 4. The assembly 600 of FIG. 6 utilizes counter-flow as taught in U.S. patent application Ser. No. 09/844,818, which is incorporated by reference herein. FIG. 6 depicts a cross-section of yet another rotary thermoelectric power generator. Advantageously, this embodiment also utilizes thermal isolation. The generator assembly 600 has a rotating assembly formed of a TE Module 601, pairs of thermally isolated heat exchangers 602, 603, fan assemblies 610, 613 with shrouds 607, 614, insulation 615, 616, 619, 620, 624, a motor rotor 617 and a shaft assembly 618.

Hotter side working fluid 611, 612 is confined by insulation 609, 615, 619, 620, 621. Cooler side working fluid 604, 606 is confined by insulation 609, 615, 616, 619, 621, and a duct 608. Spokes 605 connect a bearing 622 to the insulation 615.

Cooler side working fluid 604 enters from the left, absorbs thermal power from heat exchangers 602, thereby cooling them, and is pumped radially outward by the centrifugal action of fan blades 610. The fan blades 610 may or may not contain an inner shroud 607 which can be employed to provide structural support and act as a partial seal to keep hotter working fluid 611 separate from the cooler working fluid 606, and help guide the cooler working fluid's 606 flow. The hotter working fluid 611 enters in a radially inward direction, conveys thermal power to hotter side heat exchangers 603 and then is pumped radially outward by the action of the rotating fan blades 613. The shroud 614 may be employed to add structural rigidity to the fan blades 613, act as a partial seal to separate cooler working fluid 604 from the exiting hotter working fluid 612, and help guide the hotter working fluid's 612 flow.

Figure 7:
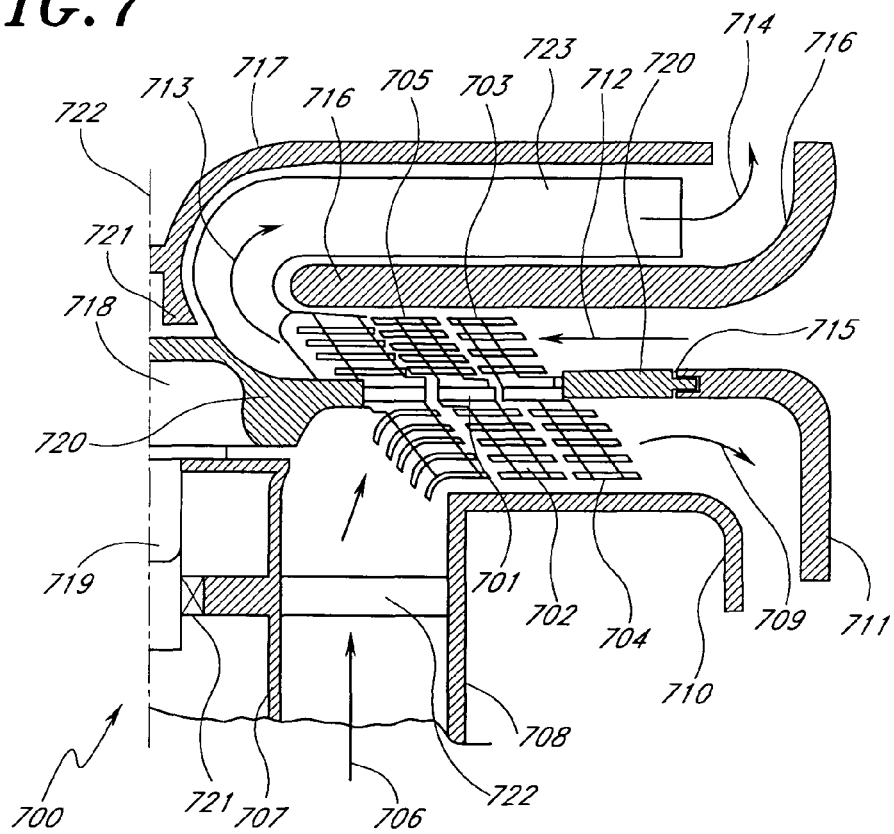
FIG. 7 depicts a radial flow generator with the hot and cold fluids flowing generally in opposite directions. Advantageously, the TE Modules are thermally isolated. Heat pipes are employed to both increase efficiency and power density.

FIG. 7 depicts a cross-section of yet another rotary thermoelectric power generator. The design of FIG. 7 is configured to operate in counter flow. The heat exchangers may or may not contain heat pipes to enhance heat transfer.

FIG. 7 depicts a radial flow power generator 700. A rotating assembly consists of a TE Module 701, heat exchangers 702, 703, with fins 704, 705, insulation 720, fan blades 723, a motor rotor 718 and a shaft 719. Bearings 721 attach the shaft assembly 719 to a non-rotating duct 717 inner support 707, spokes 722 and a duct 710. The hotter working fluid 706, 709 is confined by an inner support 707, the duct 710, insulation 720, the TE Module 701 and an exhaust duct 711. The cooler working fluid 712, 713, 714 is confined by exhaust ducts 711, 716, insulation 720, the TE Module 701 and a duct 717. A seal 715 separates the hotter working fluid 709 from the cooler working fluid 712.

The assembly 700 operates using counter-flow of the same general type discussed in the description of FIG. 6. It operates in a generally radial direction with the hot side heat exchanger 702 with its fins 704 acting as rotating fan blades to pump hotter working fluid 706, 709. Cooler working fluid 712, 713, 714 responds to the net effect of a radially outward force produced by heat exchanger heat pipes 703 and fins 704 and a larger radially outward force produced by the rotation of fan blades 723 acting on the cooler side working fluid 713, 714. The net effect of the counteracting forces is to cause fluid 712, 713, 714 to flow in the directions shown in FIG. 7. Since, the larger blade force is generated by the position of fan blades 723, being longer than, and extending radially outward farther than the heat exchangers 703 with its fins 705. Alternately, any portion of the fluids' 706, 709, 712, 713, 714 motion could be generated by external fans or pumps. In such configurations, the fan 723 may be, but need not be, deleted.

Electrical power is generated and transmitted by methods and design described in FIGS. 1 and 5-6, or any other advantageous way.

Figure 8:
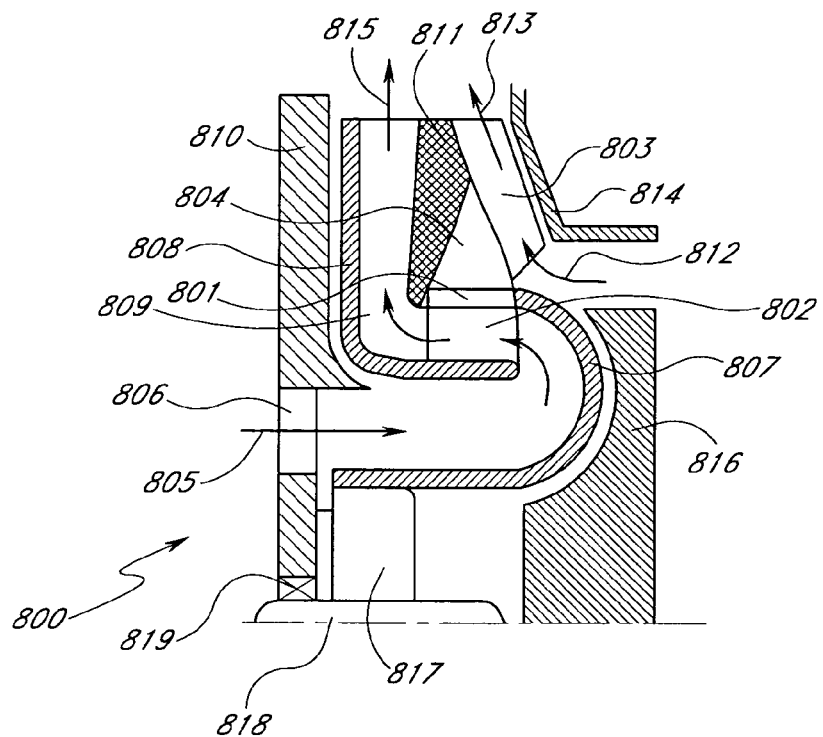
FIG. 8 depicts a power generator with both generally radial and axial flows. A solid conductive heat transfer member is utilized to transfer heat between the TE Module and the hot side fin.

FIG. 8 depicts a power generator that combines radial and axial geometries. The general arrangement 800 has a rotational portion consisting of a TE Module 801, heat exchangers 802, 803, a thermal shunt 804, insulation 811, a fan assembly 808 and 809, a duct 807, a motor rotor 817 and a shaft assembly 818. Cooler working fluid 805, 815 is confined by a shroud 807, insulation 811, a fan duct 808, and a wall 810. Hotter working fluid 812, 813 is confined by a shunt 804, a shroud 807, insulation 811, 816 and a wall 814. A bearing 819 connects rotating shaft assembly 818 to spokes 806 and wall 810.

Operation is similar to that previously described in FIG. 7, except that the cooler working fluid 805 flows through heat exchanger 802 in a generally axial direction. As depicted herein, the thermal shunt 804 and the heat exchangers 802, 803 may or may not contain heat pipes. Further, the heat exchangers 802, 803, the TE Module 801 and the thermal shunt 804 may or may not be constructed so as to be made up of thermally isolated elements as taught in U.S. patent application Ser. No. 09/844,818, entitled Improved Thermoelectrics Utilizing Thermal Isolation, filed Apr. 27, 2001, which patent application is incorporated by reference herein.

Figure 9:
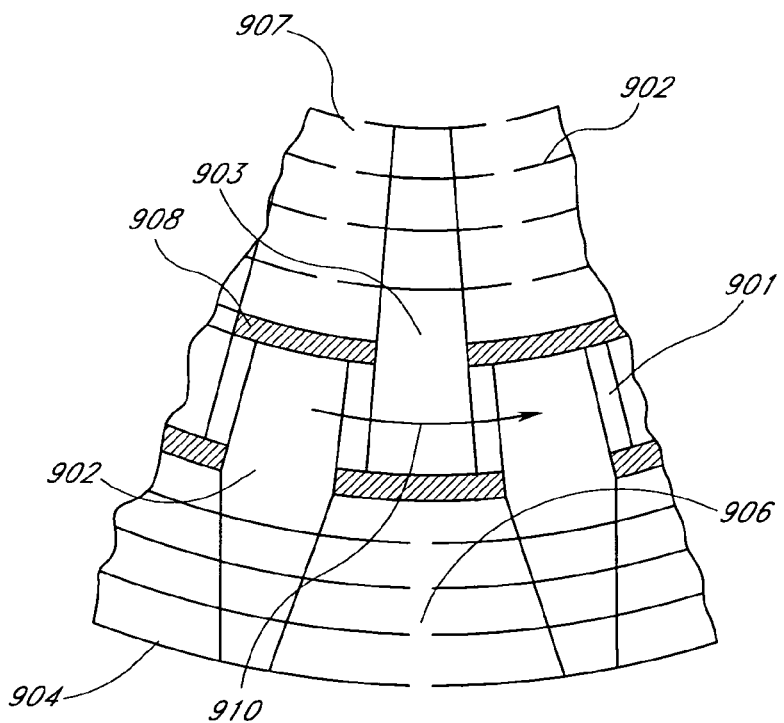
FIG. 9 depicts a portion of an axial flow power generator in which current flows through TE elements or modules and heat pipes in a circular direction about the axis of rotor rotation.

FIG. 9 depicts an integrated TE Module and heat exchanger. An assembly 900 is a segment of a ring-shaped array of TE Modules 901 with a center of rotation 909 a heat exchanger 902 with fins 904, heat exchanger 903 with fins 905 and thermal insulation 908. Gaps 906, 907 electrically isolate sections of the fins 904, 905 that are connected to the individual heat exchanger parts 902, 903. When operating, one heat exchanger 903, for example, is cooled and the other heat exchanger 902 is heated creating a thermal gradient across TE Modules 901. Electrical power is produced by the resultant heat flow.

In this configuration, the TE Modules 901 may be individual TE elements 901 with a current 910 flowing in a generally circular direction around the ring of which assembly 900 is a portion. In a portion where the TE Modules 901 are individual thermoelectric elements, for the current 910 to flow as shown, the elements 901 are alternately of N-and P-type. Advantageously, heat exchangers 902, 903 are electrically conductive in that portion between the adjacent TE elements 901. If the fins 904, 905 are electrically conductive and in electric contact with heat exchangers 902, 903, adjacent fins must be electrically isolated from on another as indicated by gaps 906, 907. Electric power can be extracted by breaking the circular current flow at one or more locations and connecting, at the breaks, to electrical circuitry as discussed in FIG. 7.

Alternately, groups of elements can be between adjacent heat exchangers 903, 902, thus forming TE Modules 901. Such TE Modules 901 can be connected electrically in series and/or parallel and may have internal provisions for electrical isolation so that gaps 906, 907 are not needed. Thermal isolation between hot and cold sides may be maintained by insulation 1008.

If the heat exchangers 902, 903 contain heat pipes, advantageously, working fluids cool the inner heat exchangers 903 and heat the outer heat exchangers 902.

Figure 10:
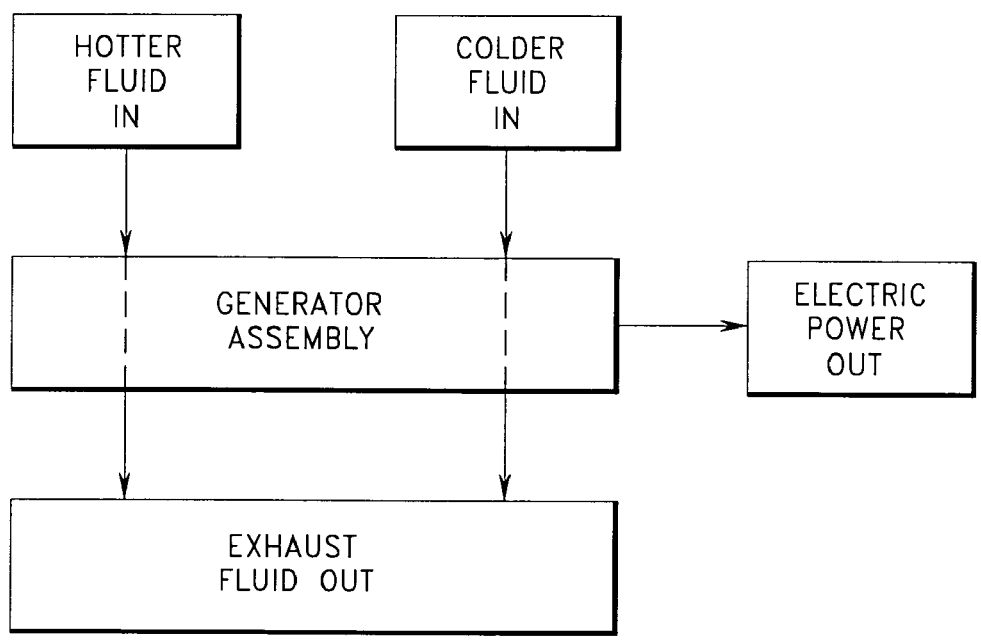
FIG. 10 depicts a system block diagram of a thermoelectric power generator.

FIG. 10 illustrates a block diagram of a thermoelectric power generator system 1000. As illustrated, the system has a hotter working fluid source 1002, a colder working fluid source 1004, a generator assembly 1006, exhaust fluid outputs 1008, and electrical power output 1010. The generator assembly 1006 is configured with any of the embodiments disclosed above, or any similar embodiment using the principals taught herein. A source of hotter fluid 1002 provide a heat source for the generator assembly 1006. A source of colder fluid 1004 provide a source of working fluid sufficiently cooler in temperature to create an advantageous temperature gradient across the thermoelectric in the generator assembly 1006. The waste working fluid exits the generator assembly at an output 1008. Electrical power from the generator assembly 1006 is provided at a power output 1010. This system 1000 is merely a generally exemplary system, and is not restrictive of the manner in which the generator assemblies of the present invention would be incorporated into a power generation system.

Figure 11:
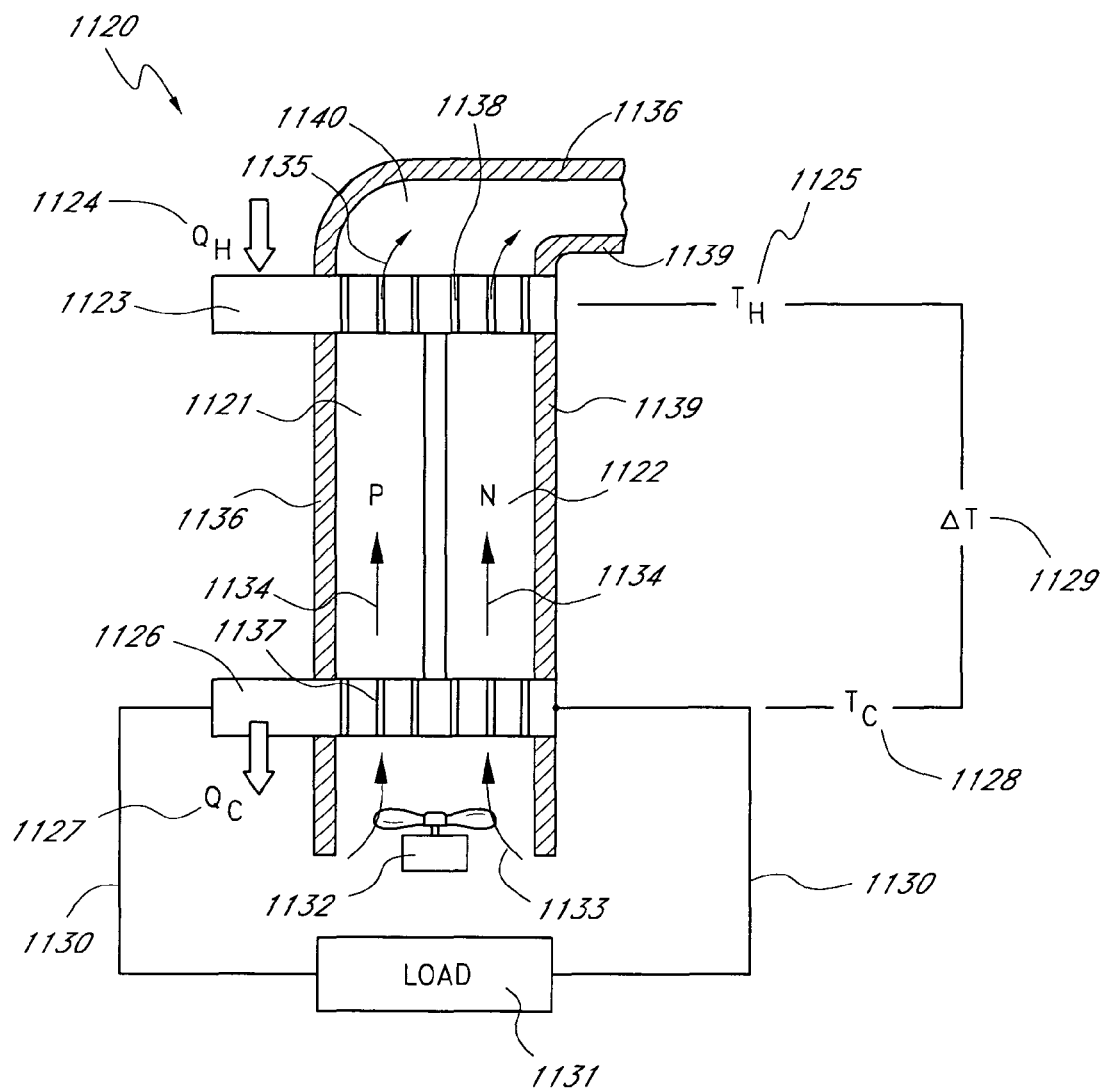
FIG. 11 depicts components of a convective TE generator as taught in U.S. Pat. No. 6,598,405.

FIG. 11 depicts a convective thermoelectric power generation system 1120. TE elements 1121, 1122 are in good thermal communication at one end at constant temperature $T_H$ 1125 with a hotter side plate 1123, and thereby with a heat source $Q_H$ 1124. At the other end, of a constant temperature $T_C$ 1128, the TEs 1121, 1122 are in thermal communication with a colder side plate or heat sink 1126 that removes waste heat $Q_C$ 1127. A duct 1136, 1139 encases the TE elements 1121, 1122 and an exhaust 1140. A load 1131 is connected to the TEs 1121, 1122 via wires 1130. A convective working fluid 1133, 1134 and 1135 is confined by the duct 1136 and 1139 to the desired flow paths through the power generator 1120. The temperature difference between the hotter side plate 1123 and the colder side plate 1126 is ΔT 129.

In operation, the fluid 1133, 1134, such as air, is pumped by a fan 1132 through the colder side plate 1126 through holes 1137 (or the plate being porous or both) and then through the TE elements 1121, 1122 (via holes or the TEs being porous) and finally through the hotter side plate 1123 (through holes 1138, through the plate being porous, or a combination). As the fluid 1133, 1134 transits from the colder side plate 1126 to hotter side plate 1123, it is heated by heat transfer from the TE elements 1121, 1122. The fluid 1135 exits at a temperature $T_H$ 1125 through the exhaust 1140. Heat $Q_H$ 1124 is supplied to the system 1120 at hotter side plate 1123 and is partially converted to electrical power for the load 1131. The remainder of its thermal power is convected away by the heated fluid 1135, or exits through colder side plate 1126 as waste heat $Q_C$ 1127. The electrical power for the load 1131 is conducted through wires 1130. Electrical power conversion efficiency generally increases with increasing ΔT 1129. Details of the operation of this type of generator can be found in U.S. Pat. No. 6,598,405.

An important characteristic of this design is that a portion of the thermal power $Q_H$ 1124 is utilized to heat the fluid 1133, 1134 instead of exiting through colder side plate 1126 as waste heat $Q_C$ 1127. Thus, the heated fluid 1135 can be used as part of a second cycle in which electrical power, in addition to that provided to the load 1131 by the generator 1120, is produced. For example, the heated fluid 1135 exiting through exhaust 1140 could be used with another power generator configuration, such as disclosed in FIGS. 13-17. Alternately, the power generator 1120, in addition to electrical power production, could provide a source of hot fluid 1135, such as air, that can be combusted, all or in part, to provide a source of hot fluid whose combustion process is enhanced, and made more efficient, by preheating.

In order to better understand the subsequent improved efficiency embodiments utilizing convective heat transport as set forth in FIGS. 13-17, a brief description of operation and efficiency for the power generator 160 when actually applied in a practical application is described with respect to FIG. 12. This description explains how the efficiency drops dramatically from the theoretical possibilities when applied in a real world setting.

Figure 12A:
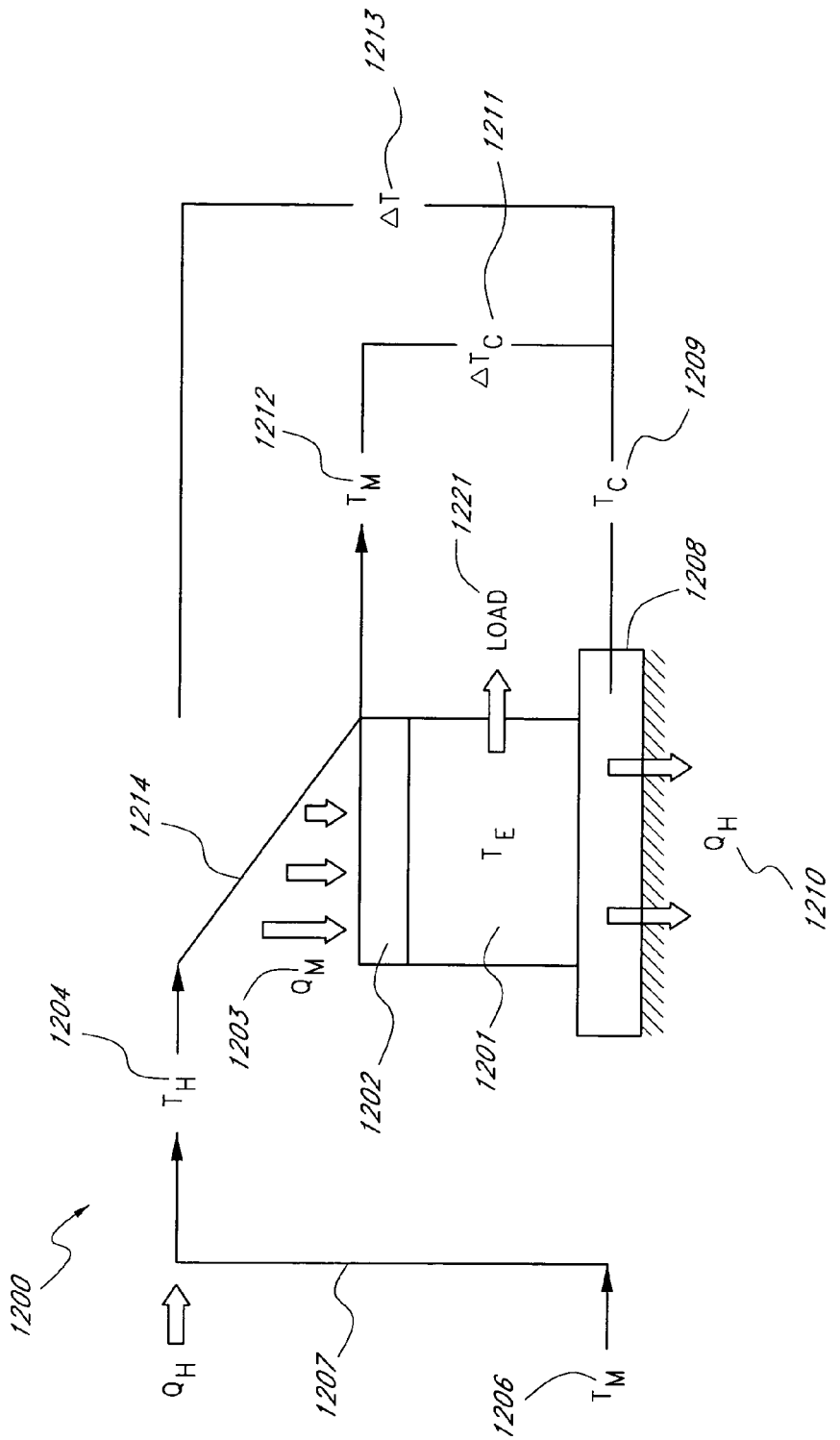
FIG. 12A depicts the operation of a traditional TE generator in which the TE hot and cold sides are at uniform temperatures, and the cold side is connected thermally to a large heat sink and the hot side is a heated moving medium.

FIG. 12A depicts a power generator 1200, where thermal power $Q_H$ 1205 in a working medium 1214 at an initial temperature $T_H$ 1204. A hotter side plate 1202 at a substantially uniform temperature $T_M$ 212 is in good thermal contact with the medium 1214 and the hotter side of a TE 1201. The colder side of the TE 1201 is in good thermal contact with a heat sink 1208 at temperature $T_C$ 1209. Waste thermal power $Q_C$ 1210 exits the power generator 1200 through the heat sink 1208. Electrical power for a load 1221 is produced by the power generator 1200. The difference between temperature $T_H$ 1204 at which the convective medium 1214 enters the power generator 1200 and exits at $T_M$ 1212 imparts thermal power $Q_M$ 1203 to the hotter side of the TE 1201. The temperature gradient across the TE 1201 is $ΔT_C$ 1211. The total temperature difference is ΔT 1213. The medium 1214 is initially at temperature $T_C$ 1206 and is heated by applied thermal power $Q_H$ 1205 as represented by a vertical line 1207.

The working medium 1214 at temperature $T_H$ 1204 transfers a portion $Q_M$ 1203 of its thermal power to the hotter side plate 1202. The working medium 1214 then exits the system at a temperature $T_M$. The balance of the thermal power from temperature $T_M$ to $T_C$ is lost or wasted. The efficiency $\phi_{TE}$ is governed in part by the Carnot term in parenthesis in Equation (9).

$$\phi_{TE} = \left(\frac{T_M - T_C}{T_M}\right)\eta_{TE} \qquad (9)$$

Power conversion efficiency is zero when $T_M$ 1212 equals $T_C$ 1204 and increases as $T_M$ 1212 increases the efficiency. Also, the portion $Q_M$ 1203 of the input power $Q_H$ 1205 that is converted to thermal power the portion $Q_M$ 1206 decreases to zero when $T_M$ 1212 equals $T_H$ 1204. Thus, for some $T_M$ 1212 between $T_C$ 1211 and $T_H$ 1204, efficiency is maximized. Analysis shows that for representative practical assumptions, the efficiency of the power generator 1200 is about 32% that theoretically possible for the power generator 160 of FIG. 1A. Accordingly, it is readily apparent that the efficiency of power generation is well below that theoretically possible when placed in a practical application. The difference is associated with heating the working medium 1214 from $T_C$ 1206 to $T_H$ 1204 and the condition that only a fraction of the thermal power input $Q_H$ 1205 is available as thermal power $Q_M$ 1203 that passes to the TE 1201.

Figure 12B:
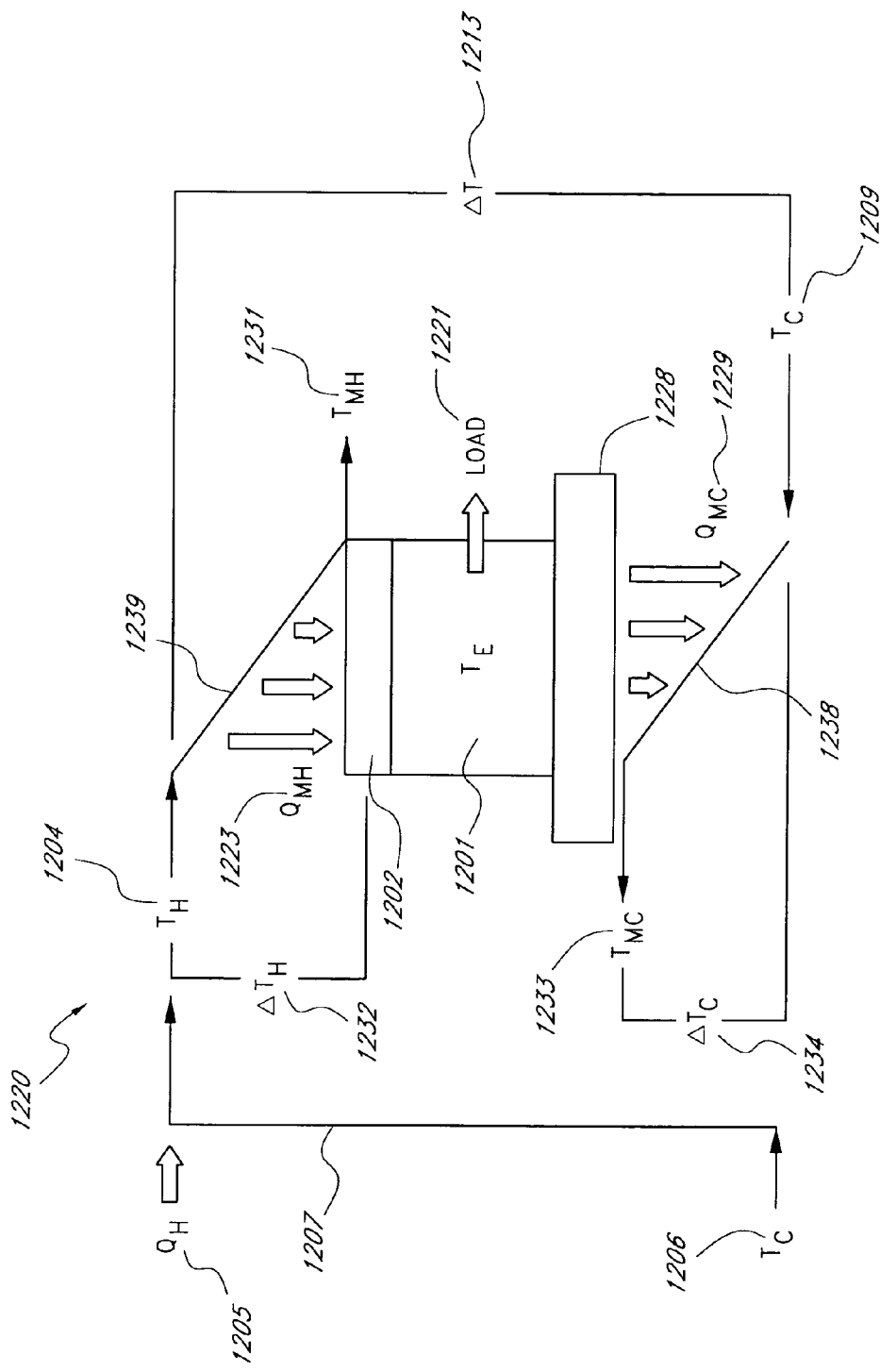
FIG. 12B depicts a power generator similar to the generator in FIG. 12A, but with working medium cooled by passing over a hotter side plate.

FIG. 12B depicts a power generator 1220, similar to generator 1200, but with working medium 1239 that is cooled by $\Delta T_H$ 1232 from $T_H$ to $T_{MH}$ 1231 by passing over the hotter side plate 1202. In doing so, the working medium imparts thermal power $Q_{MH}$ 1223 to the TE 1201, which is in good thermal contact with the hotter side plate 1202 on one side and the colder side plate 1228 on the other side. The working media 1238, initially at $T_C$ 1209, absorbs waste heat $Q_{MC}$ 1223 as it passes colder side plate 1225 and rises $\Delta T_C$ 1234 to temperature $T_{MC}$ 1233. Electrical power for a load 1214 is produced by the TE 1201. The working medium 1207 enters the system at $T_C$ 1206 and is heated by an input power source $Q_H$ 1205 to temperature $T_H$ 1204.

In operation, external thermal power $Q_H$ 1205, created by combustion of air for example, produces a hot working medium 1239 which imparts thermal power $Q_{MH}$ 1223 to the hot side of the TE 1201. The thermal power $Q_{MC}$ 1229 not converted to electrical power for the load 1221 heats the working medium 1238 to temperature $T_{MC}$ 1233 where the convective medium exits the power generator 1220. The total power input is thus $Q_H$ 1205, and the fraction $Q_{MH}$ 1223 is limited more than in the power generator 1200, since the colder side plate 1228 is at a temperature $T_{MC}$ 1233, which is higher than $T_C$ 1209. If the working media 1238, 1239 are the same material and in equal amounts or otherwise have about the same thermal capacity, $\Delta T_C$ 1234 will be somewhat less than $\Delta T_H$, 1232. Neither should be zero because then thermal power $Q_{MH}$ 1223 or $Q_{MC}$ 1229 would be zero. Similarly, the difference $T_{MH}$ 1231 minus $T_{MC}$ 1233 should not be zero or the efficiency;

$$\phi_{2B} = \left(\frac{T_{MH} - T_{HC}}{T_{MH}}\right) \quad (10)$$

would be zero. Calculations for representative conditions show that efficiency $\phi_{2B}$ is about 15% of the theoretical efficiency of the generator 160. The efficiency is low because the requirement that the convective media transfer thermal power to and from the TE can reduce substantially the temperature differential across TE 1201, and hence, the Carnot efficiency. Further the requirement just noted reduces the fraction of the total heat input that is utilized.

Figure 12C:
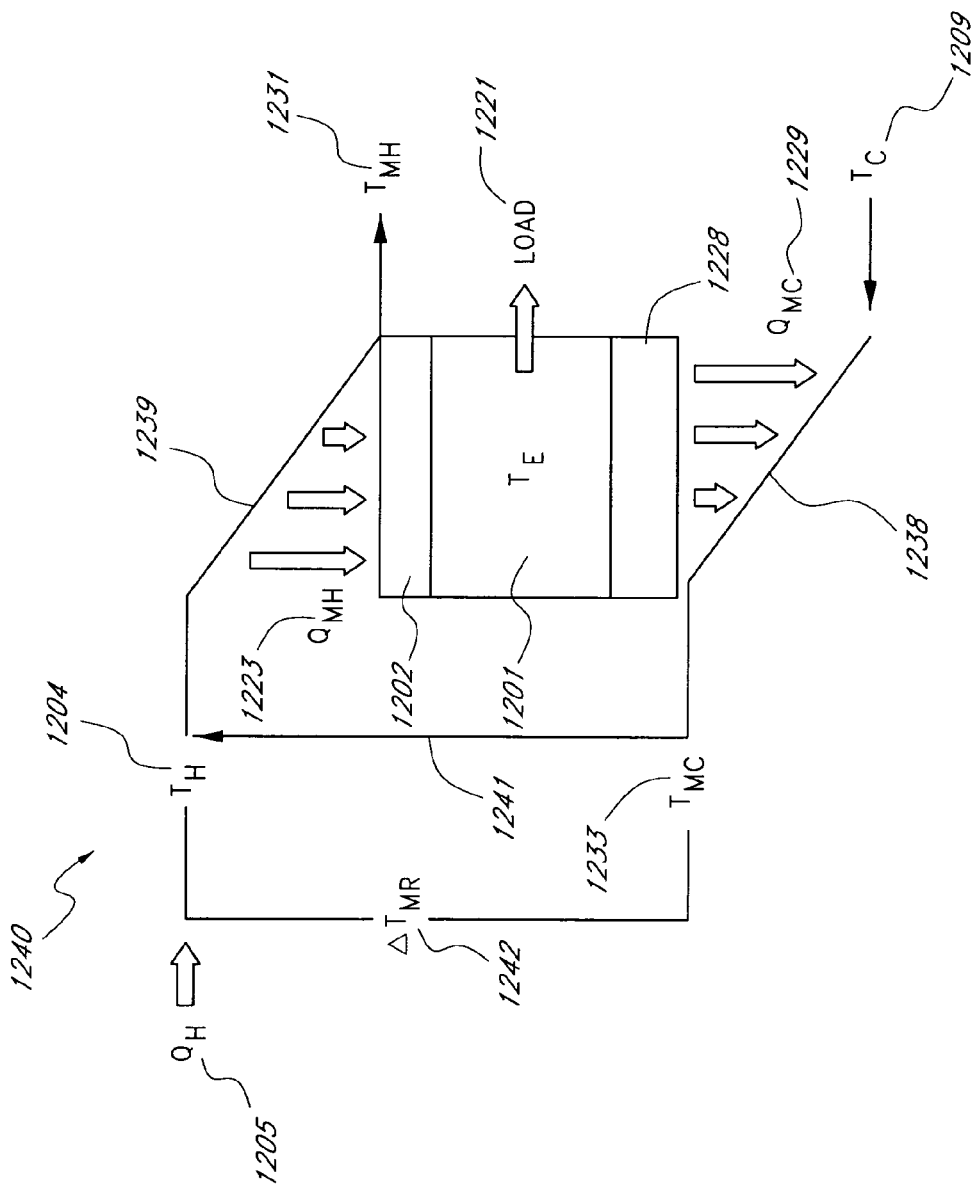
FIG. 12C depicts a TE generator with both the hot and cold side moving media and both the hot and cold ends of the TE generator at constant temperatures.

FIG. 12C depicts a power generator 1240 similar to the power generator 1220 of FIG. 12B. The descriptions are the same except that the working medium 1238 at temperature $T_{MC}$ 1233 is heated by source $Q_H$ 1205 by temperature $\Delta T_{MR}$ 1242 to temperature $T_H$ 1204.

In operation, waste heat $Q_{MC}$ 1229 entering the working medium 1238 is utilized to preheat the medium 1238 to a temperature $T_{MC}$, so that thermal power $Q_H$ 1205 need impart less thermal power to achieve the same operation and electrical power output for the load 1221. As a result, the efficiency operating in this mode is about 23% that of the generator 160. Thus, it is substantially greater than that of the generator 1220, but, nevertheless, is quite small compared to the theoretical efficiency of the generator 160.

Figure 13A:
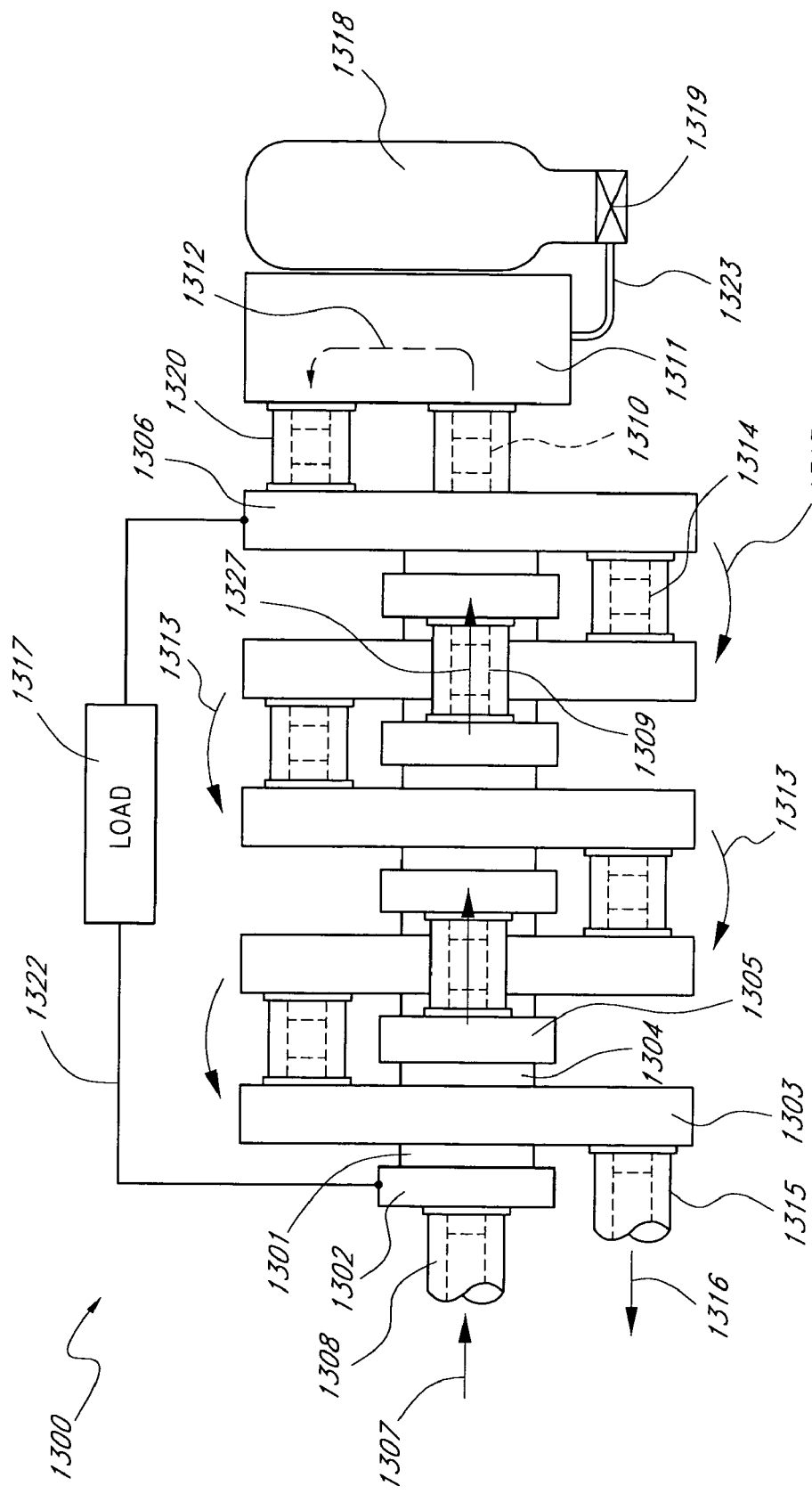
FIG. 13A depicts a stack design TE system that used regeneration of waste thermal power to improve efficiency.
Figure 13B:
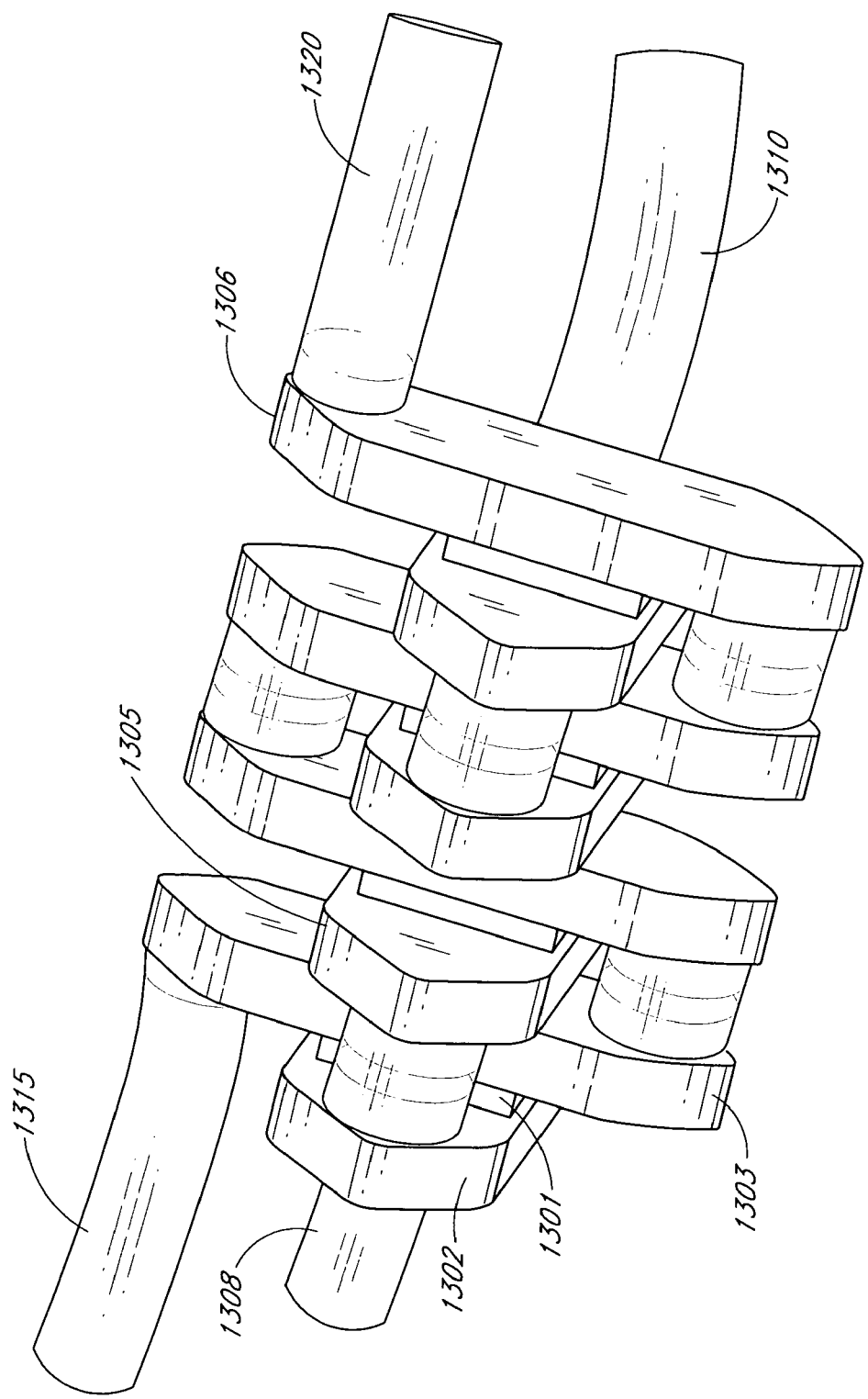
FIG. 13B depicts a perspective view of the design of FIG. 13A.

Accordingly, given that the power generators operate at such low efficiencies when applied in a practical setting, it is desirable to identify other designs that can use convective media as in FIG. 11, such as hot waste fluids, to produce electrical power at higher efficiencies and higher power levels. FIG. 13A depicts a stack design power generator 1300 of the type discussed in U.S. patent application Ser. No. 10/227,398 entitled Compact, High Efficiency Thermoelectric Systems, configured to operate as a fuel-powered auxiliary generator, a remote electric power generator, or the like.

Advantageously, a power generator 1300 contains TE elements 1301 of one conductivity type alternating with TE elements 1304 of the opposite conductivity type. The TE material is in good electrical and thermal contact with heat exchangers 1302, 1305, and at 90° to them, yet other heat exchangers 1306, 1303. This is better seen in the perspective view of FIG. 13B. Connecting heat exchangers 1302 are conduits 1309 that, advantageously, are electrical insulators and of very low thermal conductivity. Similarly, conduits 1314 connect heat exchangers 1303. Air or other fluid 1307 enters an inlet conduit 1308 and exits at an exit conduit 1310. Similarly, exhaust 1316 enters through an inlet conduit 1320 and heat exchanger 1306 and exits at an exit conduit 1315. The general direction of movement on fluid 1307 is indicated by arrows 1307, 1321. The general direction of exhaust gas 1316 is indicated by arrows 1313. A load 1317 is connected to the end heat exchangers 1302 and 1306 by wire 1322. A conduit 1310 is connected to a burner 1311, through which the working fluid, such as air 1312 passes, as does fuel 1323 from a fuel tank 1318. A valve 1319 controls fuel flow. Not shown is a blower or pump to provide air 1307 to the generator 1300. Preferably, the valve could be controlled by a feedback control system to adapt to varying conditions.

In operation, the air 1312 is combusted with the fuel 1323 with the valve 1319 controlling the flow rate of fuel 1323. The combination, when burned, heats the air 1312 to a desired temperature. The exhaust pass into the heat exchangers 1306 where a portion of the air's thermal power passes through the TEs 1301, 1304 creating electrical power in general accordance with Equation (2). In the process, incoming air 1321 is incrementally heated before entering the combustor 1311 through conduit 1310. As the exhaust 1316 continues to pass through other heat exchanges 1303, it is progressively cooled, giving up its heat to the TEs 1301, 1304, and at each stage adding to the power produced for the load 1317. A portion of the waste heat from the process progressively heats incoming air 1307 as it passes through heat exchangers 1302.

A valve 1323 can be used, along with an air supply control, not shown, to control the exhaust gas' 1312 temperature to adjust electrical power to the load 1317 and the generator's 1300 efficiency.

Any other fuel system, such as hydrogen and oxygen, could be employed. Also gaseous fuel such as propane could enter a second generator of the same type, along with the air 1307. After combustion, the exhaust can be divided appropriately to provide the heat source to both generators. Alternately, the heat source could come from nuclear isotope decay, solar power, or any other heat source. Generator 1300 can have more or fewer heat exchangers 1302, 1303 and TE elements 1301, 1304 than shown. Similarly, the TE elements 1301, 1304 can be replaced with TE modules or any other suitable solid-state energy converter. Electrical wiring 1322 and the characteristics of the load 1317 would change accordingly, and could be specified by the system designer for the particular application. If solar, nuclear or exterior combustion systems were used to transfer thermal power to the system, air 1307, 1312, 1316 could be replaced by any suitable fluid that could then be configured as either a closed or open loop system. If the heat exchangers 1302, 1303, 1306 are electrically isolated from the TEs 1301, 1304, the medium could be a liquid metal such as mercury or advantageously, less toxic mercury replacement alloys for high temperature use such as NaK, Wood's metal or any other suitable liquid metal.

Figure 13C:
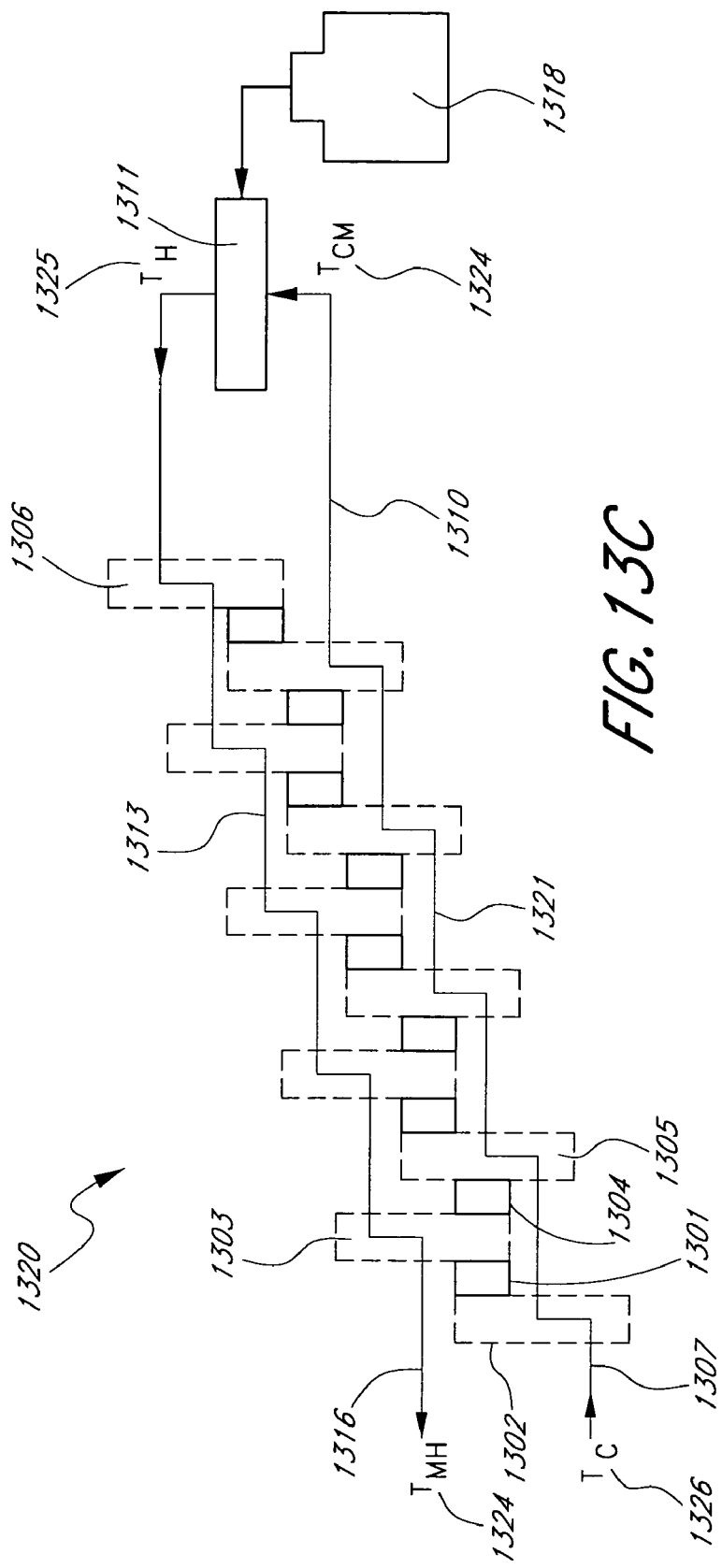
FIG. 13C depicts the operation of the system depicted in FIG. 13A.

FIG. 13C depicts an operational schematic 1323 for the generator 1300. Exhaust from the combustor 1311 enters at temperature $T_{CM}$ 1324, and in good thermal communication with the heat exchangers 1303, 1306, which in turn, are in good thermal communication with the TEs 1301, 1304. The exhaust 1316 exits at temperature $T_{MH}$ 1324. Similarly, air 1307, 1321, and 1310 at temperature $T_C$ 1326 is progressively heated to a temperature $T_{CM}$ 1324. The portion of waste heat from the exhaust not converted to electrical power (not shown), passes through the TEs 1301, 1304 into heat exchangers 1302, 1305, and air 1307. The heat source, in the form of the combustor 1311 and fuel 1318, provides thermal power to the generator 1320.

Heat flow across the temperature differences, for example, between $T_{MH}$ 1324, and $T_C$ 1302, between $T_H$ 1325 and $T_{CM}$ 1324, and elsewhere in schematic 1320, produces electrical power across each TE 1301, 1304 in accordance with Equation (2). The ratio of the total of all such electrical power produced by the TEs 1301, 1304 of generator 1300 to the thermal power from the combustor 1311, is the system efficiency. For this design, detailed calculations indicate that efficiencies can range theoretically up to about 130% of that of generator 160 if system losses and fan (or blower) power is ignored. Actual results may be considerably lower ranging from the 40% to 70% of generator 160. However, as explained above, if the actual practical operating efficiency of the generator 160 is 12%-25%, the power generator 1300 can operate at multiple time(s) the efficiency of the generator 160 in practical applications. Thus, the efficiencies can be substantially higher than those produced by generators 1220 and 1240.

Figure 14A:
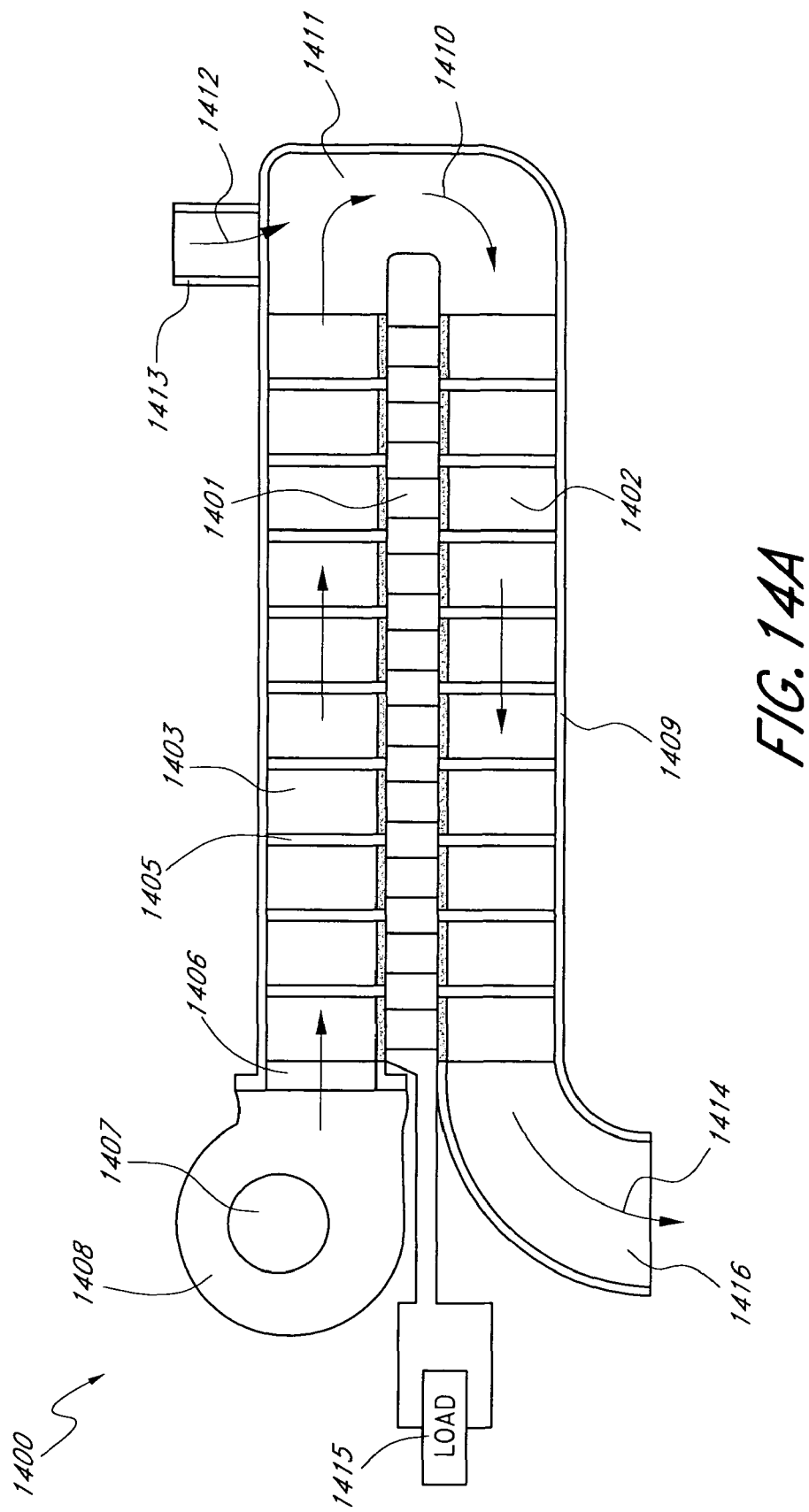
FIG. 14A depicts a TE power generator that operates efficiently at relatively low temperature, and uses a relatively high temperature convective medium heat source.

FIG. 14A depicts a generator 1400 that employs thermal isolation as taught in U.S. Pat. No. 6,539,725, and recirculation of the present disclosure, in the configuration of a linear array. The generator 1400 has a TE element 1401 or arrays of TE elements in good thermal contact with a hotter side heat exchanger 1402 and a colder side heat exchanger 1403. Air 1407 enters a blower 1408 and then passes to the inlet 1406 of the cold side heat exchangers 1403. The heated air 1410 is mixed in chamber 1411 with high temperature combustion products 1412 or other hot fluid, which enter through a duct 1413. The heated air mixture 1410 passes through hotter side heat exchangers 1402, and the air mixture 1414 exits the housing 1409 through an exhaust 1416. The housing 1409 encloses the assembly. A load 1415 is connected to the TEs 1401. Gaps 1405 separate and thermally isolate individual parings of TEs 1401 and heat exchangers 1402 and 1403.

Operation is similar to the generator 1300, except that the TEs 1401 are paired with hot and cold side heat exchangers 1402 and 1403 to achieve thermal isolation. When operating, the temperature difference across the TE elements or modules produces electrical power, which is collected and passed to the load 1415. This system is about as efficient as the generator 1300 of FIG. 13A.

Air 1407, 1410 and 1414 can be replaced with a liquid, solid, any combination of gas, liquid and solid media such as slurries, foams, nano particles distributed in fluids, or any other advantageous media. As with the power generator 1300, any heat source can be used to supply thermal power at mixing chamber 1411. Finally, the convective medium can operate in a closed loop fashion with a pump or electric motor and drive system replacing blower 1408. In the closed loop system, the exhaust 1414 is passed back to the inlet in some manner after some cooling.

Figure 14B:
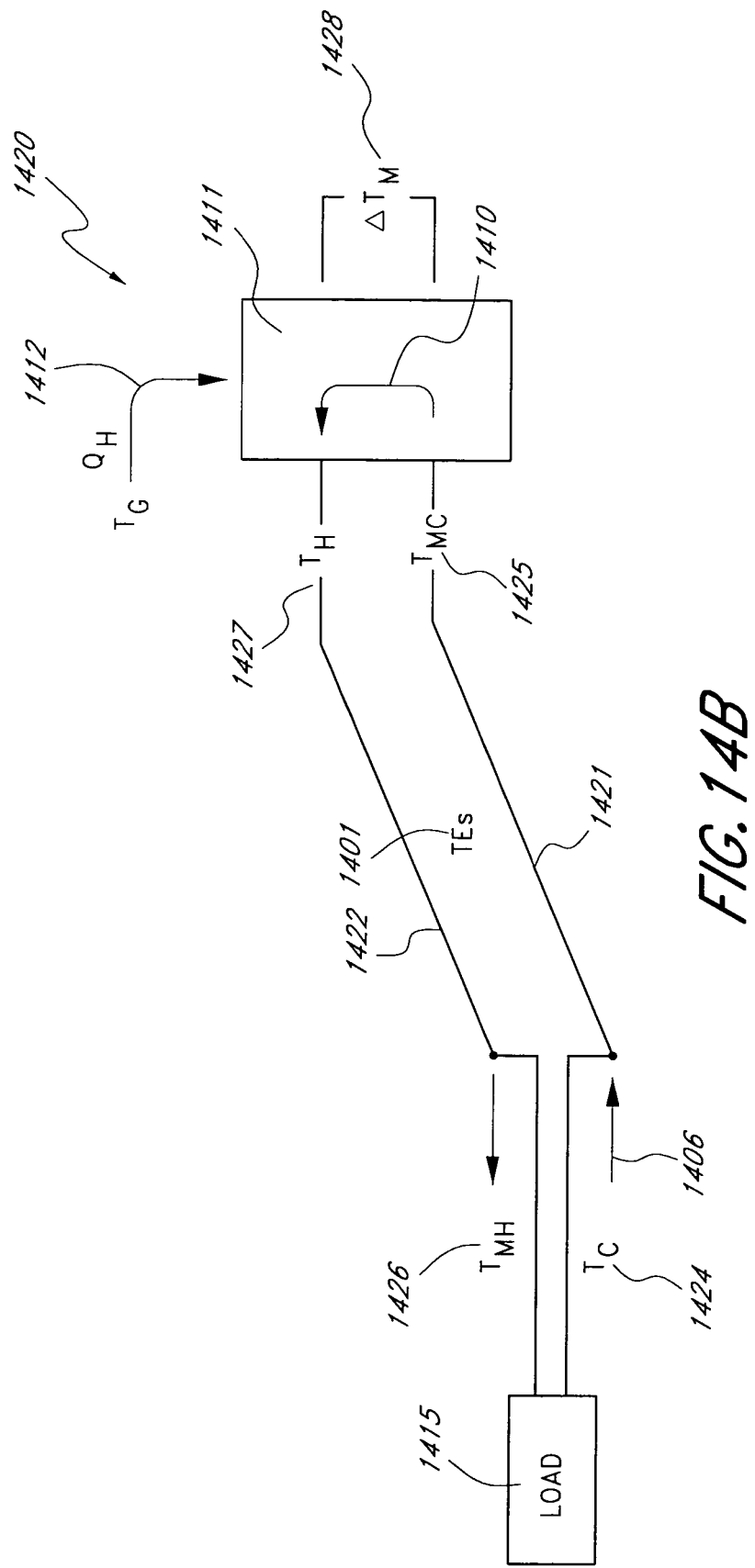
FIG. 14B depicts the operation of the system depicted in FIG. 14A.

FIG. 14B depicts a schematic 1420 of the operation of the power generator 1400 of FIG. 14A. Hot gas 1412 at temperature $T_G$ convects thermal power $Q_H$ to mixing chamber 1411 thereby raising colder side convective medium 1421 by $\Delta T_M$ 1428, from $T_{MC}$ 1425 to $T_H$ 1427. The hotter fluid 1410 cools and exits at temperature $T_{MH}$ 1426. TEs 1401 are in good thermal contact with the hot side 1410 and cold side 1406 convective media. Colder side fluid 1406 enters at temperature $T_C$ 1424 and exits at temperature $T_{MC}$ 1425. Load 1415 is electrically connected to the TEs 1401.

In operation, if there are at least forty thermally isolated heat exchangers thereby coupled to at least twenty TEs 1401, the temperature distributions 1421, 1422 in convective media 1406, 1410 will appear as nearly smooth sloping lines, as depicted in FIG. 14B. Under these conditions, efficiency can be relatively high with each thermally isolated TE segment 1401 contributing electrical power in accordance with Equation (2), and the individual hot and cold side temperatures replacing $T_H$ and $T_C$ in that Equation. Fewer TEs 1401 can also be used, and will generally produce somewhat lower efficiencies.

FIG. 15A depicts a co-generation system 1500 that has a convective generator section and isolated element generator section. The generator 1500 has a fan 1511, a heat sink 1512, a convective TE 1502, a convective medium 1504, a hotter side electrode 1505, a heat source 1506 a hotter fluid 1511, 1508, a plurality of thermally isolated heat exchangers 1507, coupled to a plurality of TEs 1501, an exit 1509 and a housing 1510. The fan 1511 pumps the convective fluid 1503 past the heat sink 1512, which is in good thermal contact with the colder side of the convective TE 1502, through which a convective medium 1504 passes. This can be accomplished with a porous thermoelectric material or holes through the thermoelectric material or in any other similar manner. The convective medium 1504 passes through the convective TE 1502 and exits through the hotter side electrode 1505, and passes the heat source 1506. The hotter side electrode 1505 may be porous or have holes in order to permit passage of the convective medium 1504. The heated fluid 1511, 1508 passes through the plurality of thermally isolated heat exchangers 1507, and exits at the exit 1509. The colder sides of the TEs 1501 are in good thermal contact with the heat sink 1512. The generator housing 1510 contains the assembly.

In operation, a convective media 1503 at a colder temperature is pumped through generator 1500 by the fan or pump 1511. It first passes through a portion of heat sink 1512 (via holes or a porous portion of the heat sink) and then through the convective TE 1502. The convective TE 1502 operates as noted briefly in the description of FIG. 11. Convective fluid 1504 exits through the hotter side electrode 1505 and, advantageously, through the heat source 1506. The heat source 1506 could be a catalytic burner or any other suitable heat source. Part of the thermal power produced is conducted to the TE 1502 and produces electrical power in that portion of generator 1500. The balance of the thermal power produced by the heat source 1506 is passed through the heat exchanger 1507 and exits after a fraction, or advantageously, nearly all, of its thermal power has been extracted and passed through by the heat exchangers 1507, the TEs 1501. TEs 1501 also produce electric power that can be combined with that from the convective TE 1502.

Other convective media besides air 1503 can be used. Specifically, co-generator 1500 can employ advantageously a low viscosity oil, such as a low molecular weight silicone oil in a closed loop system in which the fan 1511 is replaced by a pump. Also, the convective TE 1502 can be replaced by solid TEs with effective external heat transfer capabilities, like the configurations disclosed in U.S. Pat. No. 6,598,405, or by any other internal or external heat transfer methods. If the convective TE 1502 is electrically isolated from the convective medium, liquid metal or solid convective media can be used.

Figure 15B:
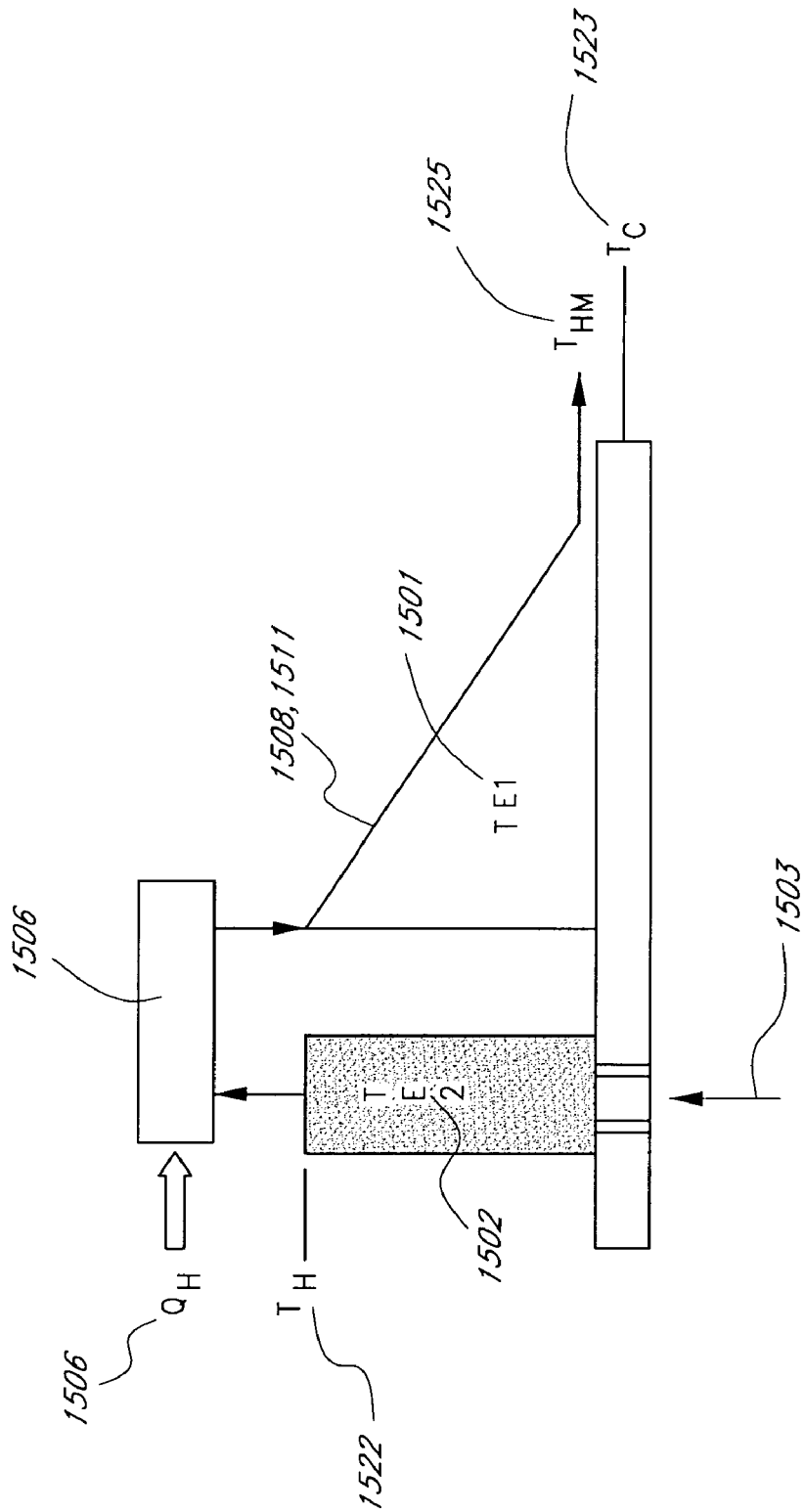
FIG. 15B depicts the operation of the system depicted in FIG. 15A.

FIG. 15B depicts a schematic for the operation of the co-generator 1500. TE1 1501 identifies one TE assembly operating as an isolated TE element array, with its hotter side 1521 descending in temperature from $T_H$ 1522 at the left to $T_{HM}$ 1525 at the lower right, and its colder side at $T_C$ 1523. The second TE generator TE2 1502 employs convective power generation technology as discussed in U.S. Pat. No. 6,598,405, and has its hotter side at $T_H$ 1522 and colder side at $T_C$ 1523. Heat source $Q_H$ 1524 imparts thermal power to the convective media 1503 entering through the convective TE 1502 and exiting as heated media 1511, 1508 to pass by the thermally isolated TEs 1501.

If essentially all of the thermal power in convective media 1521 is extracted through the thermally isolated TE1s 1501, and both TE1s 1501 and convective TE2s 1502 are operated near optimum efficiency, co-generator 1500 efficiency is about the same as that theoretically possible for generator 160 for thermoelectric materials with a $ZT_H$ from 1.0 to 2.5.

Figure 16:
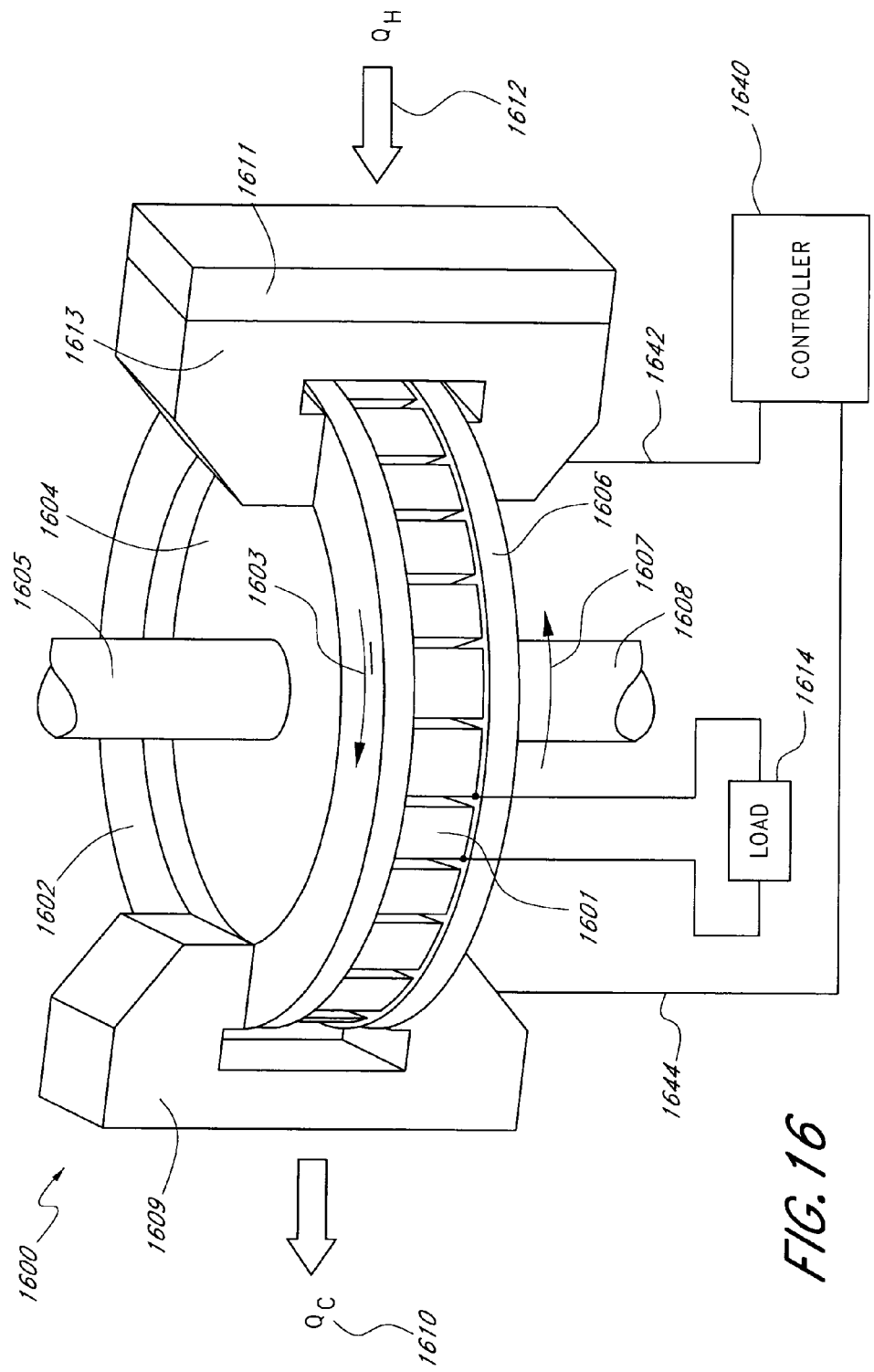
FIG. 16 depicts a power generation system in which the convective medium is a solid.

FIG. 16 depicts a power generator 1600 that utilizes a solid convective media to generate electrical power. The power generator 1600 has a plurality of TEs 1601, a load 1614, first and second conductive media 1602, 1606, a first mounting shaft 1605, a second mounting shaft 1608 a thermally insulated plate 1604, a thermal power source 1611, a hotter side heat exchanger 1613, and a colder side heat exchanger 1609. Preferably, the stationary TEs 1601 are electrically connected to the load 1614 and electrically isolated from, but in good thermal contact with, the first and the second moving media 1602, 1606. For embodiment shown in FIG. 16, the first and second moving media 1602, 1606 are disk-shaped as depicted. Preferably, the TE elements 1601 form blocks of TE material, which extend from about the outer diameter to about the inner diameter of the first and second moving media disk shapes. In an advantageous embodiment, the TE elements 1601 are slightly smaller than the width of the disks so as to not quite reach the outer circumference or the inner circumference of the first and second moving media disks 1602, 1606. A first side shaft 1605, driven by an electric motor or other drive mechanism (not shown) is attached to thermally insulative plate 1604, which in turn, is attached to first convective moving medium 1602, so that the three parts form a single moving part. The second rotating shaft 1608 is connected to the second insulative plate (not visible) and a second convective moving media 1606 in a similar fashion. Arrows 1603 and 1607 indicate the direction of motion of moving media 1602 and 1606, respectively. The thermal source 1611 provides thermal power $Q_H$ 1612 to the hotter side heat exchanger 1613 which is in good thermal contact with both the first and second moving media 1602, 1606, and imparts thermal power to the first and second moving media 1602, 1606. Similarly, the colder side heat exchanger 1609 is in good thermal contact with both the first and second moving media 1602, 1606 approximately 180 degrees from the hotter side exchanger 1613. The colder side heat exchanger 1609 extracts waste thermal power $Q_C$ 1610 from the moving media 1602 and 1606. Advantageously, the moving media 1602, 1606 have very good thermal conductivity in the vertical and axial directions of FIG. 16, and have very low thermal conductivity in the direction of rotation 1603 and 1607. In this manner, thermal insulation in accordance with the teachings of U.S. Pat. No. 6,539,725 can be obtained. This could be obtained by making small slices (like slices of pie) of copper bound together by epoxy fixating material such that the slices of copper form the first and second moving media and are thinner in the direction of movement than the gaps between TE elements 1601. In this manner, any conduction of heat from TE to TE is minimized. Alternatively, the conductive media 1602 and 1606 are made from laminated material consisting of a high conductivity material such as copper sheets oriented to have their width and length in the axial and radial planes, with the sheets separated by low conductivity epoxy adhesive to reduce thermal conductivity in the radial direction. Thermal grease, thin layers of liquid metal or any other suitable thermal transfer material, not shown, could connect thermally moving media 1602 and 1606 with heat exchangers 1609 and 1613.

Operation is similar to that of schematic 14B except the moving media 1602, 1606 transfer thermal power directly to TEs 1601. Nomenclature and the schematic of that of FIG. 14 is used to describe the operation of the generator 1600.

In operation, thermal power $Q_H$ obtained from the heat source 1611 is transferred to the moving media 1602 by heat exchanger 1613, raising the moving media temperature to $T_H$ as it exits the area of contact with the heat exchanger 1613 moving in the direction indicated by the arrow 1603. The moving media 1602 exiting the heat exchanger 1613 transfers thermal power to the TEs 1601 as it cools to temperature $T_{MH}$ 1426 before coming into thermal contact with the heat exchanger 1609 at temperature $T_C$ 1424. The moving media 1602, after being cooled to $T_C$ continues in the direction of motion indicated by the arrow 1603 toward the hotter side heat exchanger 1613. Concurrently, the second moving media 1606 is also cooled to $T_C$ 1424 by contact with the colder side heat exchanger 1609. As the second moving medium 1606 rotates, it is in good thermal contact with the TEs 1601, and extracts waste thermal power from their cold side. In the process, the second moving media 1606 is heated to temperature $T_{MC}$ 1415. The hotter side heat exchanger 1613 then heats the second side media 1606 to $T_H$ 1427. The temperature distribution of the moving media 1602, 1606 and TEs 1601 are thus similar to temperature profiles 1422 and 1421. Once a point on moving media 1602 passes, and is cooled to $T_C$ 1424 by heat exchanger 1609, the moving media 1602 becomes a portion of the colder side of a second portion of generator 1600, and once a spot on second moving media 1606 is heated to $T_H$ 1427 by heat exchanger 1613, it becomes the hot side of a portion of generator 1600. Thermal power Q1612 can come from the thermal source 1611 which can be any suitable heat source such as an isotope, catalytic burner or flame. The hotter side heat exchanger 1613 and the thermal power source 1611 can be replaced by an external source of thermal power $Q_H$ 1612 such as concentrated solar radiation, or any other suitable non-contacting source $Q_H$ 1612. If the thermal power $Q_H$ 1612 varies with time, rotational rate of shafts 1605, 1608 can be varied to maintain $T_H$ 1427 at a desired temperature. In addition, the rotational speed can be varied to change efficiency by controlling the differences between $T_{MC}$ 1425 and $T_{MH}$ 1426. It should be understood that the moving medium disks 1602, 1606 may also be constructed of liquid metal as described above.

In order to control the speed, in an advantageous embodiment, a controller 1640, with at least hotter temperature sensor 1642 and colder temperature sensor 1644 as inputs is provided to adaptively control the speed of the shafts 1605, 1608. By use of a stepper or servo motor, the speed of these can be controlled very simply through the controller 1640 with appropriate feedback. Feedback is provided to monitor the temperature of the hot and cold sides of the disks such that the speed could be varied to maintain proper operational boundaries as the conditions change. For example, if the heat source is a waste heat system where power varies over time, and waste heat becomes hotter or cooler over time, the feedback would be provided to the control system to speed the disks up as the waste heat is increasing and to slow them down as the waste heat is decreasing. Such a control system could be programmed to maintain the highest level of efficiency, the highest level of power output, or a combination for both which creates a particular desired sweet spot for operation of the power generator for the particular application. It should be noted that very high efficiency can be obtained by moving the disks quite slowly, such that the outlet temperature at $T_{MH}$ is lower than $T_{MC}$ in an amount whereby the level of boost heat required to be added is small. In this manner, most of the heat recirculates in the system and little is lost to waste. Similar control systems could be provided for any of the embodiments of FIGS. 13-17 to control the speed of the working medium movement.

FIG. 17 depicts a generator system 1700 powered by waste thermal power. As a specific example, waste thermal power recovery from the exhaust system 1706 from a vehicle engine 1705 is presented. Exhaust 1713 passes through a catalytic converter 1707, a counter flow heat exchanger 1704, a muffler 1708 and exits 1709. A Plurality of TEs 1701 are in good thermal contact with moving media 1702 and 1703 moving in directions indicated by arrows 1714, 1715 and 1716. The moving media 1702, 1703 passes through radiator 1710, a pump 1711 and through the heat exchanger 1704. Load 1712 is attached to the TEs 1701.

In operation, exhaust 1713 from an engine 1705 is processed by catalytic converter 1707 and enters counterflow heat exchanger 1704, where exhaust 1713 transfers thermal power to moving medium 1702, 1703. The cooled exhaust 1713 exits at 1709. The heated medium 1703, transfers thermal power to the TEs 1701, cooling the heated medium 1703. The moved medium is further cooled as it passes through radiator 1710. Advantageously, the working media 1702 and 1703 is a single liquid that is pumped through the closed loop configuration depicted in FIG. 17 by pump 1711. Electrical power produced is transferred to the load 1712.

As noted in the description of generator 1600, the speed of the pump 1711 can be varied to adjust performance and compensate for variations in the exhaust 1713 output from engine 1705.

Figure 17A:
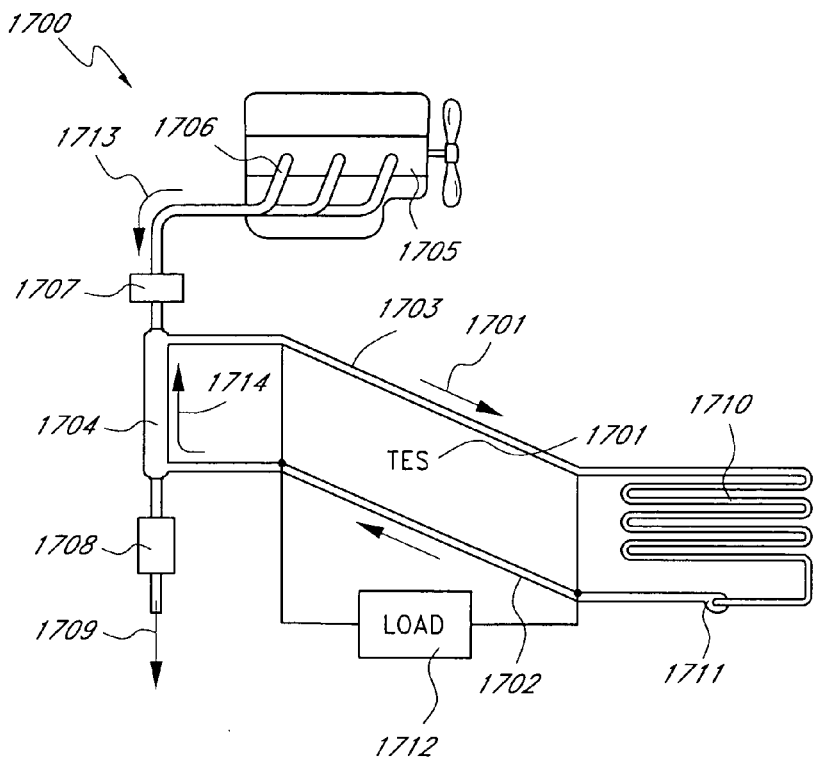
FIG. 17A depicts a waste power recovery system that uses a convective fluid in a closed loop.
Figure 17B:
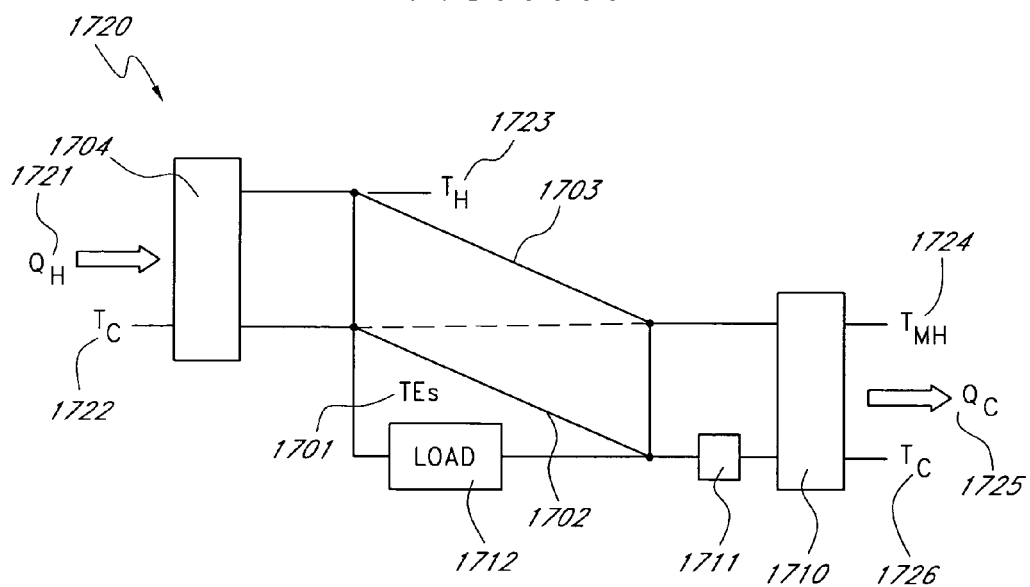
FIG. 17B depicts further the operation of the system depicted in FIG. 17A.

FIG. 17B depicts a schematic 1720 for operator of the generator 1700 of FIG. 17A. The source of thermal power $Q_H$ 1721 is in contact with the media 1702, 1703 at counterflow heat exchanger 1704. Hot side medium 1702 exits heat exchange 1704 at temperature $T_H$ 1723 and enters radiator 1710 at temperature $T_{MH}$ 1724. Waste thermal power $Q_C$ 1725 exits the system at that point. Hotter medium 1703 cools to temperature $T_C$ 1726 as it passes the TEs 1701 and the radiator 1710. The medium then passes through pump 1711, by TEs 1701 on the colder side, and enters heat exchanger 1704 at temperature $T_{MC}$ 1722.

In operation, the medium 1702, 1703 is pumped in a closed loop through the heat exchanger 1704 where it absorbs thermal power $Q_H$ 1721 and exits at temperature $T_H$ 1723. The medium 1702 transfers thermal power to TEs 1701, thereby cooling medium 1702 to $T_{MH}$ 1724. Waste thermal power $Q_C$ 1725 is rejected from the system by radiator 1710, and in the process, cools the hotter medium 1703 to $T_C$ 1726. Now cooled medium 1702 absorbs waste thermal power from the cool side of TEs 1701, and in the process, heats medium 1702 to temperature $T_{MC}$ 1722. Power produced by the flow of thermal power through TEs 1701, is delivered to load 1712. This process occurs continuously during operation.

It will be noted that across the TEs of the various power generation systems of FIGS. 13-17, the TEs may operate at significantly different temperatures from one end of the assembly to the other end of the assembly, in addition to the gradient from the hotter side to the colder side of the individual TE elements. Therefore, advantageously, the TEs are configured to best operate under the differing operating temperatures and conditions. For example, for the TEs operating at the hotter temperatures, the TEs may be made with a different TE material than those operating at a cooler temperatures. For example, for the hotter of the TE elements, the TE elements may be made from a material well suited for hotter operational temperatures, such as Silicon Germaniun, or the like, and for the cooler of the TE elements, the TE elements may be made of a material such as Bismuth Telluride. Other materials are known that are particularly suited for hotter or cooler operating temperatures.

Another advantageous manner in which to accommodate the varying operational temperatures of the TEs in the power generators of FIGS. 13-17 is to construct the individual TE elements in a non-uniform manner, such as making the colder side portion of at least some of the TE elements of a first material, and the hotter side portion of the same TE elements from a second TE material. In other words, individual TE elements are constructed of at least two different materials, to create what is known as a unicouple TE element. The two materials may be also be of the same TE material, but doped differently from the hotter side of the TE element than from the colder side. For example, doping at a first concentration level at the colder side of the TE element and at a different concentration level for the hotter side, may provide suitable properties for optimal operation. Alternatively, or in combination, a differing dopant could be used for the hotter side than used for the colder side of each TE element or at least some of the TE elements.

In yet another embodiment, the construction of the TEs would be varied, ideally, in a constantly changing manner across the assembly in accordance with the temperature changes. More practically, the TEs would be divided into groups of operating ranges, and the TE elements constructed appropriately for the operating range. For example, as depicted in FIG. 17B, a dotted line through the middle of the temperature profile representing the operating temperature across the TEs in the system, represents one manner in which to construct the TEs. To the left of the Figure, a small or no portion of the TEs would be constructed of a first TE material suited to operate at a cooler temperature, and all or most of the TE element would be constructed of a second TE material that has better characteristics for operating at hotter temperatures. At the right side of the assembly, all or most of each TE elements would be constructed of a TE material with characteristics better suited for operating at a cooler temperature, and no portion, or a small portion of each TE element would be constructed of a TE material with characteristics better suited for operating at a hotter temperature. It will be apparent that the percentage or portion of each TE element or at least some of the TE elements that is constructed of a TE material better suited for hotter side operation will be the upper portion in FIG. 17B, and the portion of each TE element or at least some of the TE elements that is constructed of a TE material better suited for colder temperatures will be the bottom portion in FIG. 17B. The dotted line marks a theoretical distribution of such material. Practically, the TE elements are grouped into two or more categories, rather than a gradual change in each TE element, which would be more costly. For example a group of TE elements constructed of 90%/10% portions, a group at 50%/50% and an group at 10%/90%, where the convention is (hotter material %)/(colder material %). Other proportions are feasible.

It should be noted that although the embodiment of FIG. 17 is used for discussion, this principle of TE construction applies to any TE system where the operating temperatures differ across the assembly.

The individual teachings in this application may be combined in any advantageous way. Such combinations are part of this invention. Similarly, the teachings of U.S. Pat. No. 6,539,725 entitled Improved Efficiency Thermoelectrics Utilizing Thermal Isolation, and U.S. application Ser. No. 09/971539, entitled Thermoelectric Heat Exchanger related to rotary heat exchangers can be used in combination with this application to create variations on the teachings herein. For example, the heat exchangers of the hot and/or cold sides, in one embodiment, are configured in portions that are substantially thermally isolated from other portions of the heat exchanger. Similarly, portions of the thermoelectric module, in one embodiment, are thermally isolation from other portions of the thermoelectric module.

Furthermore, various convective power generators of FIGS. 13-17 can be combined together to provide a power generator that operates at two different levels.

Accordingly, the inventions are not limited to any particular embodiment, or specific disclosure. Rather, the inventions are defined by the appended claims, in which terms are presented to have their ordinary and customary meaning.

What is claimed is:

1. A thermoelectric power generation system comprising:
a plurality of thermoelectric elements forming an assembly having a cooler side and a hotter side during operation, wherein a working media collects waste heat from the colder side of at least some of the plurality of thermoelectric elements, and wherein after collecting said waste heat, the working media is further heated and then dispenses at least a portion of its heat to said hotter side of at least some of the plurality of thermoelectric elements, thereby generating power with at least some of the plurality of thermoelectric elements, wherein at least some of the plurality of thermoelectric elements are configured to allow the working media to pass through them; and
at least one electrical system that transfers said power from said assembly.

2. The thermoelectric power generation system of claim 1, wherein at least some of the plurality of thermoelectric elements are porous.

3. The thermoelectric power system of claim 1, wherein the working media receives heat from a heat source.

4. The thermoelectric power system of claim 3, wherein the heat source is solar.

5. The thermoelectric power system of claim 3, wherein the heat source is a radioactive isotope.

6. The thermoelectric power system of claim 3, wherein the heat source is combustion.

7. The thermoelectric power system of claim 1, wherein the working media is heated by combusting a portion of the working media.

8. The thermoelectric power system of claim 1, wherein the working media is a fluid.

9. The thermoelectric power system of claim 8, wherein the working media is a combination of at least one fluid and at least one solid.

10. The thermoelectric power system of claim 1, wherein the working media is a solid.

11. The thermoelectric power system of claim 1, further comprising a power generation controller.

12. The thermoelectric power system of claim 11, wherein the power generation controller controls the movement of the working media.

13. A thermoelectric power generation system comprising:
a plurality of thermoelectric elements forming an assembly having a cooler side and a hotter side during operation, wherein the working media collects waste heat from the colder side of at least some of the plurality of thermoelectric elements, and wherein after collecting said waste heat, the working media is further heated and then dispenses at least a portion of its heat to said hotter side of at least some of the plurality of thermoelectric elements, thereby generating power with at least some of the plurality of thermoelectric elements, wherein at least some of the plurality of thermoelectric elements are configured to allow convective heat transport by the working media in the direction of the hotter side of the assembly; and
at least one electrical system that transfers said power from said assembly.

14. The thermoelectric power system of claim 13, wherein at least some of the plurality of thermoelectric elements are configured to allow the working media to pass through them.

15. A thermoelectric power generation system comprising:
a plurality of thermoelectric elements forming an assembly having a cooler side and a hotter side during operation, wherein the working media collects waste heat from the colder side of at least some of the plurality of thermoelectric elements, and wherein after collecting said waste heat, the working media is further heated and then dispenses at least a portion of its heat to said hotter side of at least some of the plurality of thermoelectric elements, thereby generating power with at least some of the plurality of thermoelectric elements;
a plurality of heat exchangers, wherein at least some the heat exchangers are in thermal communication with at least some of the thermoelectric elements and at least some of the heat exchangers provide thermal isolation in a direction of working media movement; and
at least one electrical system that transfers said power from said assembly.

16. A thermoelectric power generation system comprising:
a plurality of thermoelectric elements forming an assembly having a cooler side and a hotter side during operation, wherein a working media collects waste heat from the colder side of at least some of the plurality of thermoelectric elements, and wherein after collecting said waste heat, the working media is further heated and then dispenses at least a portion of its heat to said hotter side of at least some of the plurality of thermoelectric elements, thereby generating power with at least some of the plurality of thermoelectric elements, wherein at least one of the plurality of thermoelectric elements are configured to allow convective heat transport by the working media in the direction of the hotter side of the assembly, and at least a plurality of others of the thermoelectric elements are configured to provide thermal isolation in a direction of working media movement; and at least one electrical system that transfers said power from said assembly.

17. The thermoelectric power generation system of claim 16, wherein the working media is a working fluid, and wherein the working fluid convects heat through the at least one of the plurality of thermoelectric elements, and is thereby heated.

18. A method of generating power with a thermoelectric power generation system, the method comprising the steps of:

moving a working media to thermally interact with a plurality of thermoelectric elements forming an assembly having a cooler side and a hotter side during operation;

transferring heat into the working media from the cooler side of at least some of the plurality of thermoelectric elements;

adding further heat to the working media;

dispensing heat from the working media to the hotter side of at least some of the plurality of thermoelectric elements, to thereby generate power with at least some of the plurality of thermoelectric elements; and passing the working media through at least some of the plurality of thermoelectric elements.

19. The method of claim 18, wherein adding further heat to the working media includes providing heat from a heat source selected from a group consisting of: solar, radioactive isotope, combustion, and combusting a portion of the working media.

20. A method of generating power with a thermoelectric power generation system, the method comprising the steps of:

moving a working media to thermally interact with a plurality of thermoelectric elements forming an assembly having a cooler side and a hotter side during operation;

transferring heat into the working media from the cooler side of at least some of the plurality of thermoelectric elements;

adding further heat to the working media;

dispensing heat from the working media to the hotter side of at least some of the plurality of thermoelectric elements, to thereby generate power with at least some of the plurality of thermoelectric elements; and convecting heat with the working media in the direction of the hotter side of at least one of the thermoelectric elements.

21. The method of claim 20, wherein convecting heat with the working media in the direction of the hotter side of at least one of the thermoelectric elements includes passing the working media through the at least one of the thermoelectric elements.

22. A method of generating power with a thermoelectric power generation system, the method comprising the steps of:

moving a working media to thermally interact with a plurality of thermoelectric elements forming an assembly having a cooler side and a hotter side during operation;

transferring heat into the working media from the cooler side of at least some of the plurality of thermoelectric elements;

adding further heat to the working media;

dispensing heat from the working media to the hotter side of at least some of the plurality of thermoelectric elements, to thereby generate power with at least some of the plurality of thermoelectric elements; and thermally isolating at least some of the thermoelectric elements in a direction of working media movement.

* * * * *